US012593697B2

(12) United States Patent
Jang et al.

(10) Patent No.: US 12,593,697 B2
(45) Date of Patent: Mar. 31, 2026

(54) INTEGRATED PASSIVE DEVICES (IPD) HAVING A BASEBAND DAMPING RESISTOR FOR RADIOFREQUENCY POWER DEVICES AND DEVICES AND PROCESSES IMPLEMENTING THE SAME

(71) Applicant: MACOM Technology Solutions Holdings, Inc., Lowell, MA (US)

(72) Inventors: Haedong Jang, San Jose, CA (US); Mehdi Hasan, Milpitas, CA (US); Marvin Marbell, Cary, NC (US); Jeremy Fisher, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 607 days.

(21) Appl. No.: 18/145,961

(22) Filed: Dec. 23, 2022

(65) Prior Publication Data

US 2024/0213184 A1    Jun. 27, 2024

(51) Int. Cl.
| | |
|---|---|
| *H01L 23/00* | (2006.01) |
| *H01L 21/48* | (2006.01) |
| *H01L 23/053* | (2006.01) |
| *H01L 23/367* | (2006.01) |
| *H01L 23/66* | (2006.01) |
| *H01L 25/16* | (2023.01) |

(52) U.S. Cl.
CPC .......... *H01L 23/66* (2013.01); *H01L 21/4817* (2013.01); *H01L 23/053* (2013.01); *H01L 23/367* (2013.01); *H01L 24/48* (2013.01); *H01L 25/165* (2013.01); *H01L 2223/6672* (2013.01); *H01L 2224/48175* (2013.01); *H01L 2924/1033* (2013.01); *H01L 2924/1205* (2013.01); *H01L 2924/1207* (2013.01); *H01L 2924/13064* (2013.01); *H01L 2924/1421* (2013.01)

(58) Field of Classification Search
CPC ... H01L 23/66; H01L 21/4817; H01L 23/053; H01L 23/367; H01L 24/48; H01L 25/165; H01L 2223/6672; H01L 2224/48175; H01L 2924/1033; H01L 2924/1205; H01L 2924/1207; H01L 2924/13064; H01L 2924/1421; H01L 2223/6655
See application file for complete search history.

(56) References Cited

U.S. PATENT DOCUMENTS

| | | | |
|---|---|---|---|
| 9,979,360 | B1 | 5/2018 | McLaren et al. |
| 11,336,253 | B2 | 5/2022 | Arigong et al. |

(Continued)

OTHER PUBLICATIONS

International Patent Application No. PCT/US2023/084585; Int'l Search Report and the Written Opinion; dated Mar. 27, 2024; 12 pages.

(Continued)

*Primary Examiner* — Elias Ullah
(74) *Attorney, Agent, or Firm* — BakerHostetler

(57) ABSTRACT

A transistor device includes a metal submount; a transistor die arranged on said metal submount; an IPD component arranged on said metal submount, and the IPD component having a baseband damping resistor arranged on a thermally conductive dielectric substrate; and a second IPD component arranged on said metal submount, and the second IPD component may include a baseband decoupling capacitor arranged on a thermally conductive dielectric substrate.

32 Claims, 25 Drawing Sheets

(56) References Cited

U.S. PATENT DOCUMENTS

| | | | |
|---|---|---|---|
| 2012/0175784 A1* | 7/2012 | Lin | H01L 21/486 |
| | | | 257/E23.174 |
| 2020/0304074 A1 | 9/2020 | Jang et al. | |
| 2021/0384866 A1 | 12/2021 | Wilson et al. | |
| 2022/0084950 A1 | 3/2022 | Noori et al. | |

OTHER PUBLICATIONS

Liang et al.; "Low Stress and High Thermal Conductive Underfill for Cu/Low-k Application"; IEEE Electronic Components and Technology Conf.; 2008; p. 1958-1962.
"Thin and Thick Film—What are Thin and Thick Film Resistor?"; https://eepower.com/resistor-guide/resistor-materials/thin-and-thick-film/; EEPOWER; Dec. 2022; accessed Mar. 8, 2024; 6 pages.

* cited by examiner

600 PROCESS OF FORMING IPD COMPONENTS

602 FORMING THE SUBSTRATE

604 FORMING THE METALLIZATION LAYERS

606 ARRANGING THE AT LEAST ONE DEVICE ON THE SUBSTRATE

1

INTEGRATED PASSIVE DEVICES (IPD) HAVING A BASEBAND DAMPING RESISTOR FOR RADIOFREQUENCY POWER DEVICES AND DEVICES AND PROCESSES IMPLEMENTING THE SAME

FIELD OF THE DISCLOSURE

The disclosure relates to integrated passive devices (IPD) having a baseband damping resistor for radiofrequency power devices. The disclosure further relates to devices having integrated passive devices (IPD) having a baseband damping resistor for radiofrequency power devices. The disclosure further relates to processes for implementing integrated passive devices (IPD) having a baseband damping resistor for radiofrequency power devices.

BACKGROUND OF THE DISCLOSURE

Transistor packages such as radio frequency (RF) power amplifier transistor products have limited linearizability. Accordingly, the transistor packages may address this limitation by damping the baseband impedances. In particular, the transistor package may implement integrated passive devices (IPD) components having a baseband decoupling capacitor. Typically, the baseband decoupling capacitor is mounted on printed circuit board (PCB) based substrates, PCB based material substrates, and/or the like. However, these substrates have relatively low thermal conductivity.

Further, it has been contemplated to implement the transistor package to further damp the baseband impedance by implementation of a resistor. However, implementation of the resistor results in generation of heat. Therefore, when a damping resistor is mounted on the substrate for addressing baseband impedance, operation of the resistor results in a high temperature rise exceeding a rated temperature of the components on the substrate, such as a PCB. Therefore, using the resistor on substrates, such as a PCB, was avoided, impractical, and/or the like.

Accordingly, what is needed is IPD components, a RF product that implements IPD components, and/or the like configured for utilization of a damping resistor to improve linearizability of the RF power amplifiers.

SUMMARY OF THE DISCLOSURE

In one general aspect, a transistor device includes a metal submount. The transistor device in addition includes a transistor die arranged on said metal submount. The transistor device moreover includes an IPD component arranged on said metal submount, the IPD component having a baseband damping resistor arranged on a thermally conductive dielectric substrate. The transistor device also includes a second IPD component arranged on said metal submount, the second IPD component may include a baseband decoupling capacitor arranged on a thermally conductive dielectric substrate.

In one general aspect, a process includes providing a metal submount. The process in addition includes arranging a transistor die on said metal submount. The process moreover includes arranging an IPD component having a baseband damping resistor arranged on a thermally conductive dielectric substrate. The process also includes arranging a second IPD component that may include a baseband decoupling capacitor arranged on a thermally conductive dielectric substrate.

2

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
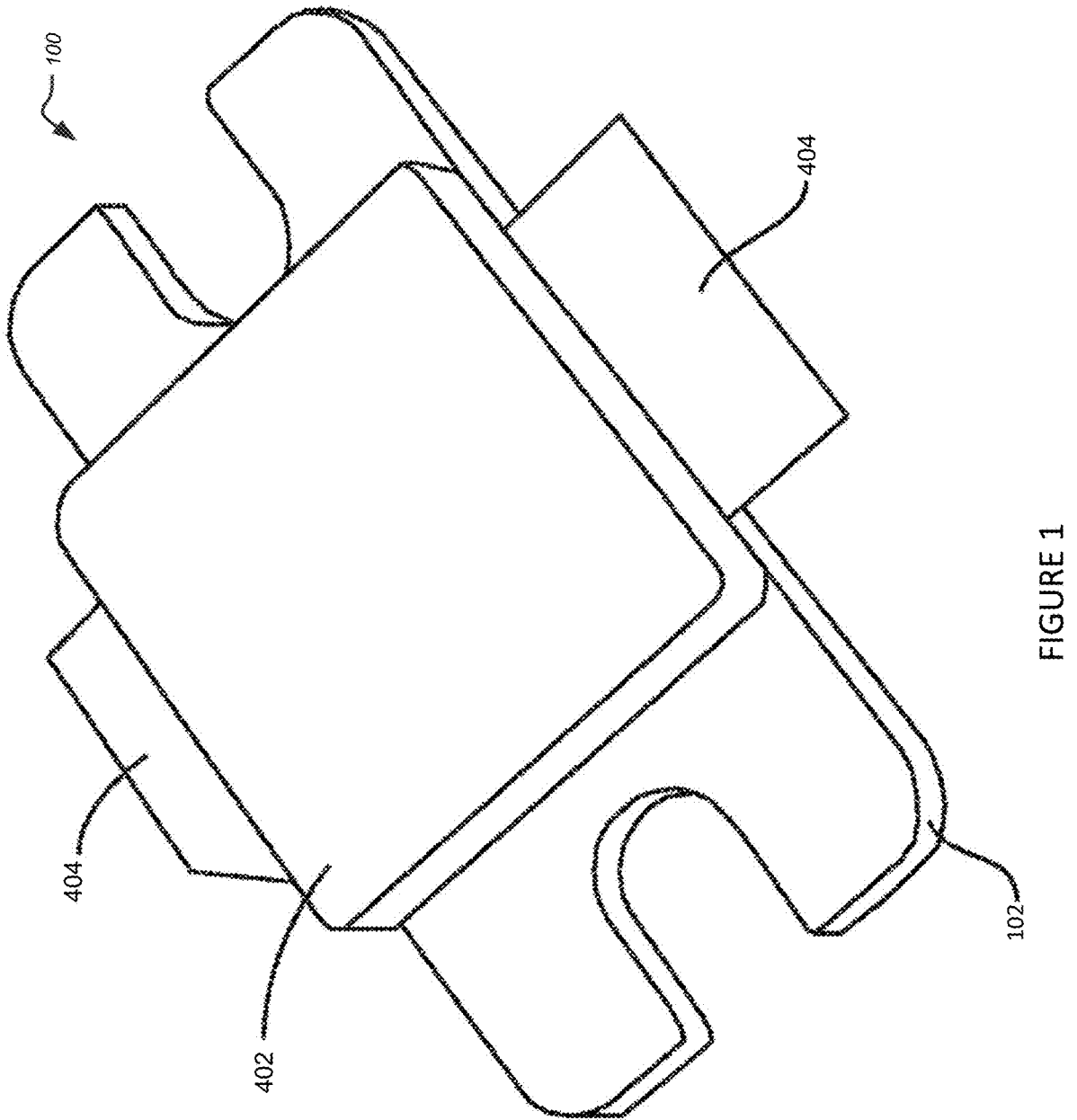
FIG. 1 illustrates a perspective view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosure relates to IPD components, a device implementing IPD components, a process of implementing IPD components, a process for implementing a device having IPD components, and/or the like implementing a damping resistor. In aspects, a resistor or multiple resistors may be integrated in an IPD or a capacitor, which is used in an output shunt match of the RF power devices. The resistor may be located between the IPD or the capacitor and a wire bonding pad may connect to the in-package or external baseband decoupling capacitor. This implementation of the disclosure effectively improves the linearizability of the devices by damping the baseband impedances. The integrated resistor on the high thermal conductivity substrate such as silicon carbide (SiC) or silicon can effectively dissipate the heat through the substrate.

In aspects of the disclosure, the resistor or resistors may be implanted on a high thermal conductivity substrate and connected to the baseband decoupling capacitor through bonding wires effectively damping the baseband impedances and dissipating the heat through the substrate maintaining the temperature under the component temperature rating.

In aspects of the disclosure, integrating a resistor or resistors on the high thermal conductivity substrate (SiC) or (Si) IPD or the capacitor effectively dissipates heat through the substrate while providing the impedance damping of the baseband decoupling capacitor connected to the IPD or the capacitor. The disclosure further relates to a radio frequency (RF) package implementing a radio frequency (RF) device with implementations of IPD components that include a damping resistor.

FIG. 1 illustrates a perspective view of a package according to the disclosure.

Figure 2:
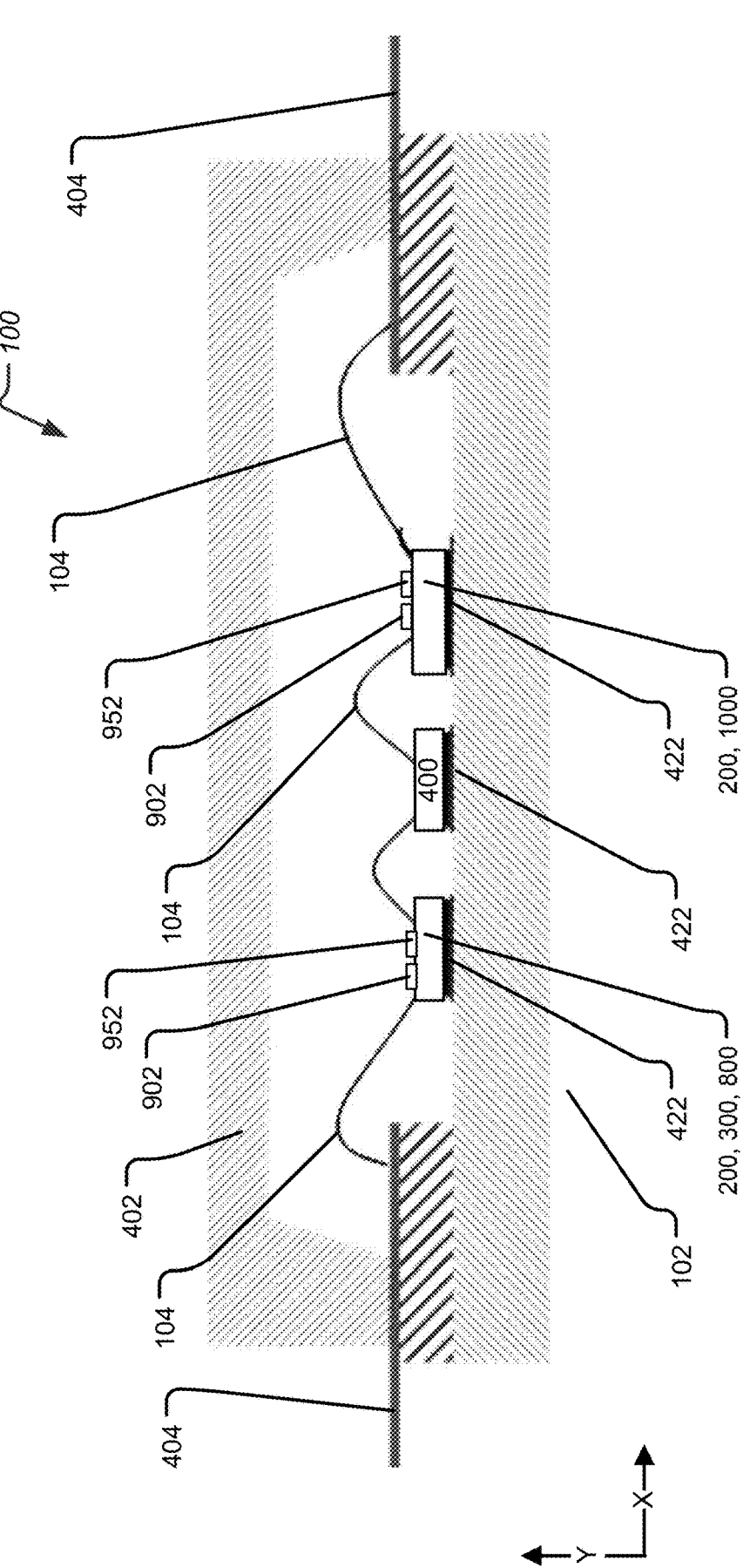
FIG. 2 illustrates a cross-sectional view of the package according to the disclosure.

FIG. 2 illustrates a cross-sectional view of the package according to the disclosure.

The aspects of FIG. 1 and FIG. 2 may include any one or more features as described herein. In particular, FIG. 1 and FIG. 2 show an exemplary implementation of a package 100 that may include any one or more other features, components, arrangements, and the like as described herein. In particular, FIG. 1 and FIG. 2 show the package 100 that may be implemented as a RF package, a RF amplifier package, a RF power amplifier package, a RF power transistor package, a RF power amplifier transistor package, and/or the like as described herein.

With reference to FIG. 1, the package 100 may include a ceramic body 402 and one or more metal contacts 404. In other aspects, the package 100 may include a plurality of the one or more metal contacts 404; and in aspects the package 100 may include a plurality of parallel implementations of the one or more metal contacts 404.

With reference to FIG. 2, the package 100 may include one or more semiconductor devices 400, a support 102, at least one or more of a first IPD component 200, a second IPD component 800, a third IPD component 300, and/or a fourth IPD component 1000. In aspects, the package 100 may include a plurality of the first IPD component 200, the second IPD component 800, the third IPD component 300, and/or the fourth IPD component 1000; and in aspects the package 100 may include a single implementation of one or more of the first IPD component 200, the second IPD component 800, the third IPD component 300, and/or the fourth IPD component 1000.

One or more of the first IPD component 200, the third IPD component 300, and/or the like may implement a resistor 902. The resistor 902 may be implemented as a resistor, a damping resistor, a baseband damping resistor, a baseband resistor, baseband suppression resistor, and/or the like.

One or more of the first IPD component 200, the second IPD component 800, the third IPD component 300, and/or the like may implement a capacitor 952. The capacitor 952 may be implemented as a capacitor, a decoupling capacitor, a baseband decoupling capacitor, and/or the like.

The first IPD component 200, the second IPD component 800, the third IPD component 300, and/or the fourth IPD component 1000 may be implemented as at least part of a RF device as described herein. The first IPD component 200, the second IPD component 800, the third IPD component 300, and/or the fourth IPD component 1000 may implement matching networks, harmonic termination circuitry, integrated passive devices (IPD), capacitors, resistors, inductors, and/or the like. In aspects, the first IPD component 200, the second IPD component 800, the third IPD component 300, and/or the fourth IPD component 1000 may be used for matching networks, pre-matching, bias-decoupling, thermal-grounding, and/or the like in RF power products and/or the like.

Inside the package 100, the one or more semiconductor devices 400 may be attached to the support 102 via a die attach material 422. One or more interconnects 104 may couple the one or more semiconductor devices 400 to a first one of the one or more metal contacts 404, a second one of the one or more metal contacts 404, the first IPD component 200, the second IPD component 800, the third IPD component 300, and the fourth IPD component 1000, and/or the like. Additionally, inside the package 100, the first IPD component 200, the second IPD component 800, the third IPD component 300, and/or the fourth IPD component 1000 may be arranged on the support 102 via a die attach material 422 with the one or more interconnects 104 shown in an exemplary configuration that may connect between the package 100, the first IPD component 200, and/or the one or more semiconductor devices 400. The support 102 may dissipate the heat generated by the one or more semiconductor devices 400, the first IPD component 200, the second IPD component 800, the third IPD component 300, and/or the fourth IPD component 1000, while simultaneously isolating and protecting the one or more semiconductor devices 400 and the first IPD component 200, the second IPD component 800, the third IPD component 300, and/or the fourth IPD component 1000 from the outside environment. In aspects, the die attach material 422 may utilize an adhesive, soldering, sintering, eutectic bonding, thermal compression bonding, ultrasonic bonding/welding, a clip component, and/or the like as described herein.

The first IPD component 200, the second IPD component 800, the third IPD component 300, and/or the fourth IPD component 1000 may be implemented at least in part with a silicon carbide (SiC) substrate, a silicon substrate, an Alumina substrate, an Aluminum Nitride (AlN) substrate, a Beryllium oxide (BeO) substrate, a Titanium Oxide (TiO) substrate, a metal-oxide substrate, a high dielectric metal-oxide substrate, a high dielectric substrate, a thermally conductive dielectric material substrate, a thermally conductive high dielectric material substrate and/or other similar thermal conductivity performance dielectric material substrate.

In aspects, the resistor 902 or multiple implementations of the resistor 902 may be integrated in one or more of the first IPD component 200, the third IPD component 300, and/or the like, which may be used in an output shunt match of the one or more semiconductor devices 400 of the package 100.

In aspects, the resistor 902 or multiple implementations of the resistor 902 may be integrated in one or more of the first IPD component 200, the second IPD component 800, the third IPD component 300, and/or the like together with the capacitor 952, which may be used in an output shunt match of the one or more semiconductor devices 400 of the package 100.

The resistor 902 may be located between one or more of the first IPD component 200, the second IPD component 800, the third IPD component 300, and/or the like and the capacitor 952; and a wire bonding pad implemented by one or more of the first IPD component 200, the second IPD component 800, the third IPD component 300, and/or the like may connect to the in-package or external implementation of the capacitor 952. Accordingly, implementations of the package 100 effectively improves the linearizability of the one or more semiconductor devices 400 by damping the baseband impedances. Additionally, the resistor 902 may be integrated on the high thermal conductivity substrate, such as silicon carbide (SiC) and/or the like as described herein, to effectively dissipate the heat generated by the resistor 902 through the substrate.

In aspects of the disclosure, the package 100 may be implemented with the resistor 902 or multiple implementations of the resistor 902 implanted on the high thermal conductivity substrate; the resistor 902 or multiple implementations of the resistor 902 may be connected to the capacitor 952 through the one or more interconnects 104, such as bonding wires; and this configuration may effectively damp the baseband impedances and dissipate the heat through the substrate maintaining the temperature of components of the package 100 under a component temperature rating.

In aspects of the disclosure, integrating the resistor 902 or multiple implementations of the resistor 902 on the high thermal conductivity substrate of one or more of the first IPD component 200, the third IPD component 300, and/or the like effectively dissipates heat through the substrate; and may provide the impedance damping of the baseband decoupling capacitor implemented by the capacitor 952 that may be connected to one or more of the first IPD component 200, the second IPD component 800, the third IPD component 300, and/or the like.

The one or more semiconductor devices 400 may be implemented as one or more of a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration, and/or the like.

The package 100 may be implemented to include an open cavity configuration suitable for use with the first IPD component 200, the second IPD component 800, the third IPD component 300, and the fourth IPD component 1000 of the disclosure. In particular, the open cavity configuration may utilize an open cavity package design. In some aspects, the open cavity configuration may include a lid or other enclosure for protecting interconnects, circuit components, the first IPD component 200, the second IPD component 800, the third IPD component 300, the fourth IPD component 1000 the one or more semiconductor devices 400, and/or the like.

The one or more interconnects 104 may utilize ball bonding, wedge bonding, compliant bonding, ribbon bonding, metal clip attach, and/or the like. In one aspect, the one or more interconnects 104 may utilize the same type of connection. In one aspect, the one or more interconnects 104 may utilize different types of connections.

The one or more interconnects 104 may be include various metal materials including one or more of aluminum, copper, silver, gold, and/or the like. In one aspect, the one or more interconnects 104 may utilize the same type of metal. In one aspect, the one or more interconnects 104 may utilize different types of metal. The one or more interconnects 104 may connect to one or more bonding pads by an adhesive, soldering, sintering, eutectic bonding, thermal compression bonding, ultrasonic bonding/welding, a clip component, and/or the like as described herein.

The support 102 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 102 may include an insulating material, a dielectric material, and/or the like.

Figure 3:
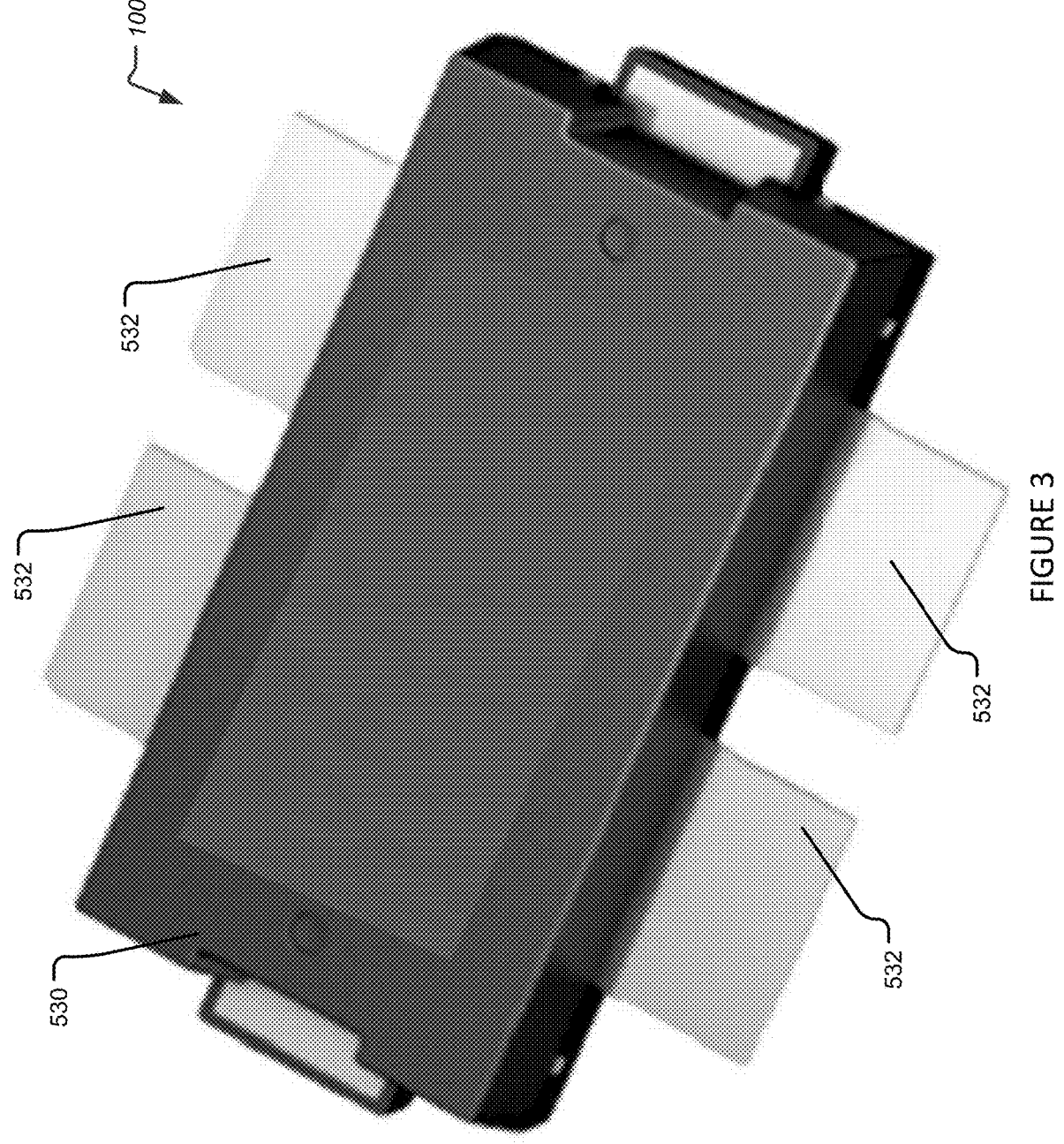
FIG. 3 illustrates a perspective view of a package according to the disclosure.

FIG. 3 illustrates a perspective view of a package according to the disclosure.

Figure 4:
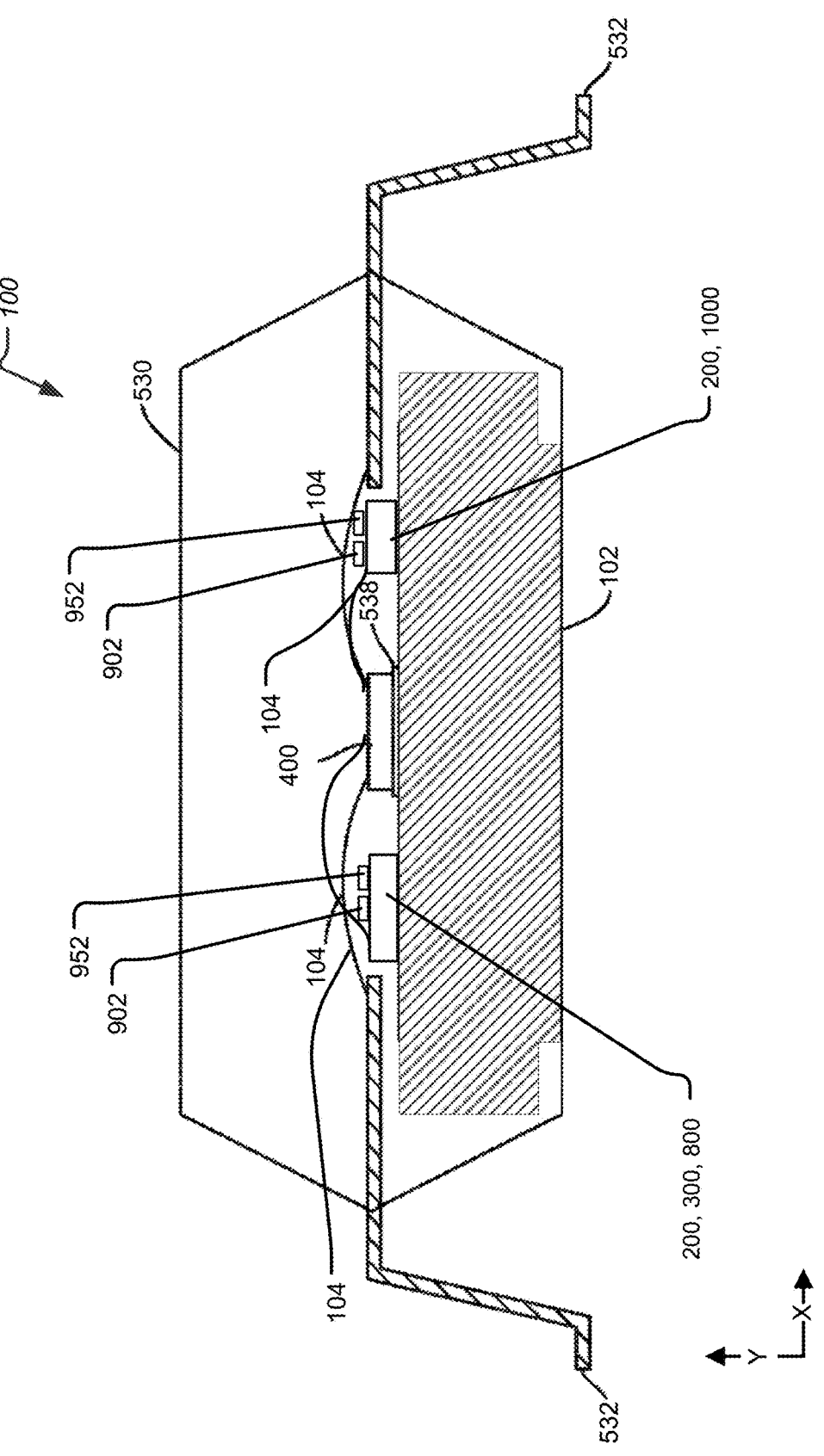
FIG. 4 illustrates a cross-sectional view of the package according to FIG. 3.

FIG. 4 illustrates a cross-sectional view of the package according to FIG. 3.

In particular, FIG. 3 and FIG. 4 show another exemplary implementation of the package 100 that may include any one or more other features, components, arrangements, and the like as described herein. In particular, FIG. 3 and FIG. 4 show the package 100 may be implemented as a RF package, a RF amplifier package, a RF power amplifier package, a RF power transistor package, a RF power amplifier transistor package, and/or the like as described herein. The package 100 may include the one or more semiconductor devices 400, the first IPD component 200, the second IPD component 800, the third IPD component 300, the fourth IPD component 1000, and/or the like. Further, one or more of the first IPD component 200, the second IPD component 800, the third IPD component 300, and/or the fourth IPD component 1000 may implement at least in part the resistor 902 and the capacitor 952 as described herein. As further described herein, the first IPD component 200, the second IPD component 800, the third IPD component 300, and/or the fourth IPD component 1000 may be implemented with thermal conductivity, thermal management, and/or the like increasing efficiency, performance, and reliability.

Additionally, inside the package 100, the first IPD component 200 may be arranged on the support 102 as described herein with the one or more interconnects 104 shown in an exemplary configuration. Moreover, inside the package 100, the second IPD component 800, the third IPD component 300, and/or the fourth IPD component 1000 may be arranged on the support 102 and/or the first IPD component 200 as described herein with the one or more interconnects 104 shown in an exemplary configuration. The package 100 may include an over-mold 530, one or more input/output pins 532, and the support 102. The over-mold 530 may substantially surround the one or more semiconductor devices 400, which are mounted on the support 102 using a die attach material 538. The over-mold 530 may be formed of a plastic or a plastic polymer compound, which may be injection molded around the support 102, the one or more semiconductor devices 400, the first IPD component 200, the second IPD component 800, the third IPD component 300, the fourth IPD component 1000, and/or the like, thereby providing protection from the outside environment. The one or more semiconductor devices 400, the first IPD component 200, the second IPD component 800, the third IPD component 300, and/or the fourth IPD component 1000 may be coupled to the one or more input/output pins 532 via the one or more interconnects 104.

The one or more interconnects 104 may connect to the one or more bonding pads 914. The one or more interconnects 104 may be implemented as one or more wires, wire bonds, leads, vias, edge platings, circuit traces, tracks, clips, and/or the like. In one aspect, the one or more interconnects 104 may utilize the same type of connection. In one aspect, the one or more interconnects 104 may utilize different types of connections.

In one aspect, the over-mold configuration may substantially surround the one or more semiconductor devices 400, the first IPD component 200, the second IPD component 800, the third IPD component 300, the fourth IPD component 1000, the resistor 902, the capacitor 952, and/or the like. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the one or more semiconductor devices 400, the first IPD component 200, the second IPD component 800, the third IPD component 300, the fourth IPD component 1000, and/or the like, thereby providing protection for the first IPD component 200, the one or more semiconductor devices 400, the third IPD component 300, the second IPD component 800, and other components of the package 100 from the outside environment.

Figure 5:
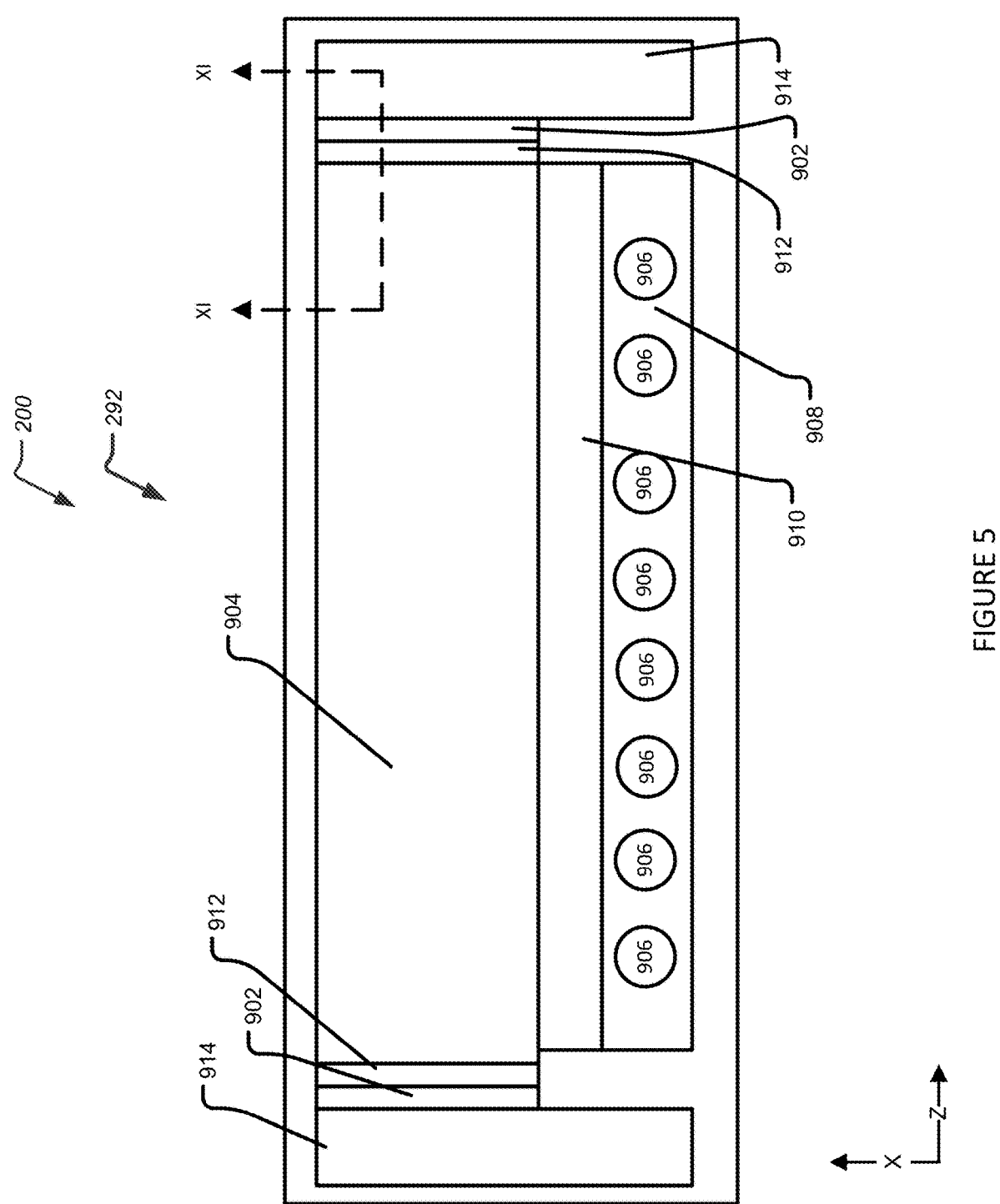
FIG. 5 illustrates a top view of the first IPD component according to aspects of the disclosure.

FIG. 5 illustrates a top view of the first IPD component according to aspects of the disclosure.

Figure 6:
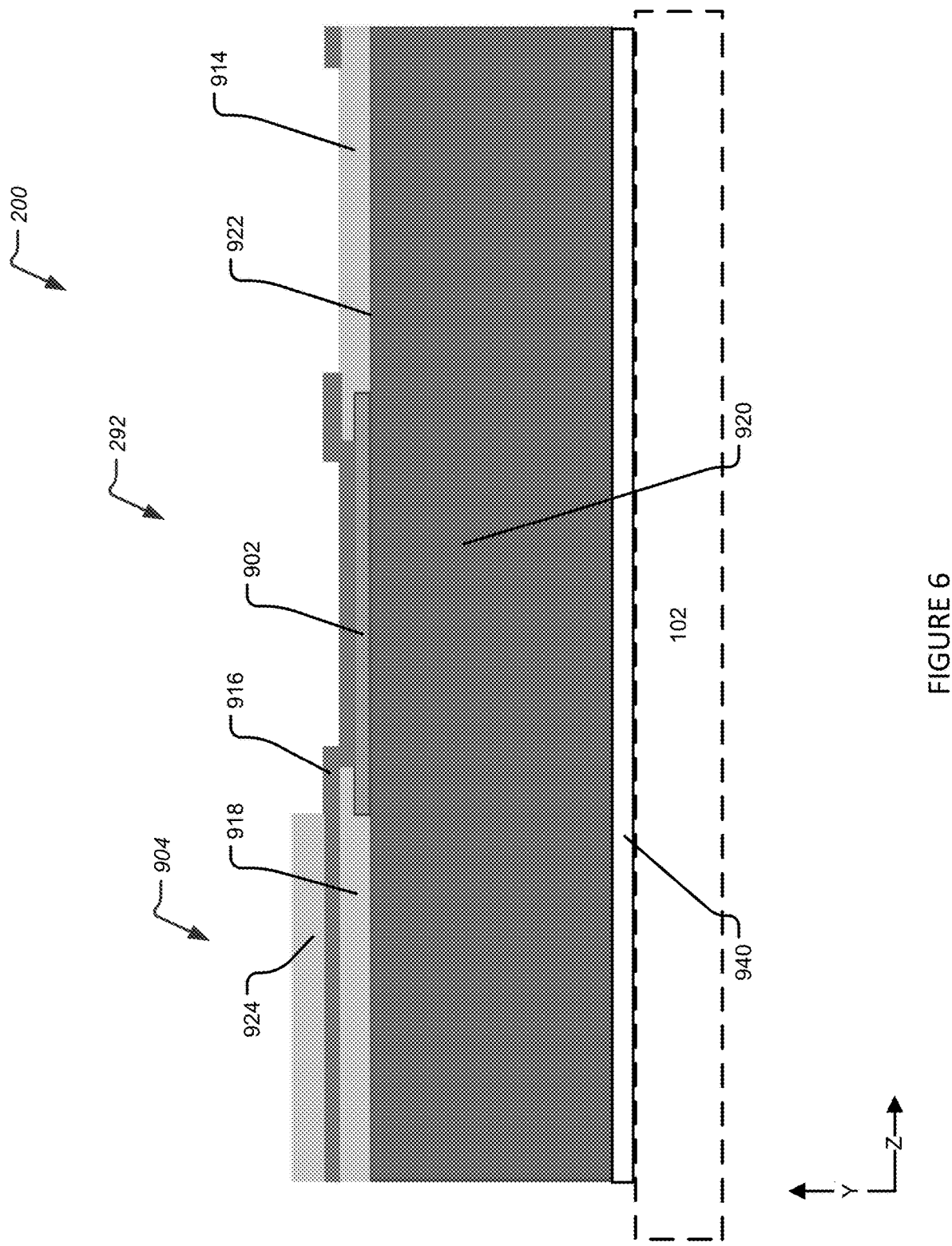
FIG. 6 illustrates a cross-sectional view of an implementation of the first IPD component according to FIG. 5.

FIG. 6 illustrates a cross-sectional view of an implementation of the first IPD component according to FIG. 5.

Figure 7:
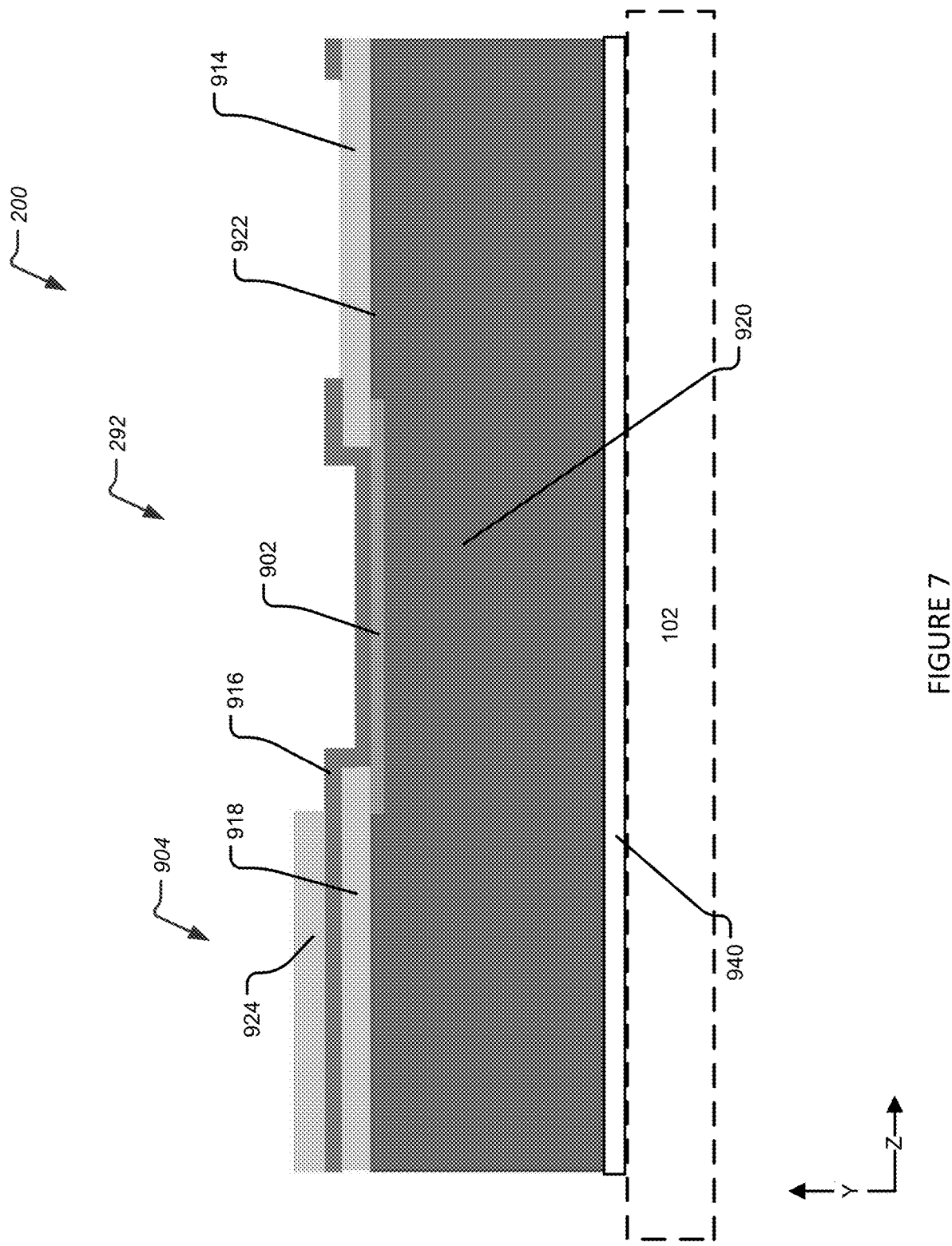
FIG. 7 illustrates a cross-sectional view of another implementation of the first IPD component according to FIG. 5.

FIG. 7 illustrates a cross-sectional view of another implementation of the first IPD component according to FIG. 5.

In particular, FIG. 5, FIG. 6, and FIG. 7 show an implementation of the first IPD component 200 that may include any one or more other features, components, arrangements, and the like as described herein. In particular, FIG. 5 illustrates a top view of the first IPD component 200 according to aspects of the disclosure.

Referring to FIG. 5, in one aspect, the first IPD component 200 may be implemented as an output capacitor IPD 292. The output capacitor IPD 292 may include a DC blocking capacitor 904, the resistor 902, one or more bonding pads 914, one or more vias 906, a top metal 908, a first connecting metal 910, a second connecting metal 912, and/or the like.

In aspects, the one or more bonding pads 914 may be configured as a connection between the output capacitor IPD 292 and the capacitor 952. The connection may include implementations of the one or more interconnects 104; and the connection may include implementations of adhesive, soldering, sintering, eutectic bonding, ultrasonically welding, and/or the like as described herein. In aspects, the one or more bonding pads 914 may be configured as a wire bonding pad for connecting to the capacitor 952. Accordingly, the one or more bonding pads 914 may provide an electrical connection to the capacitor 952. In aspects, the one or more bonding pads 914 may comprise a metallic material such as copper, gold, nickel, palladium, silver, and the like, and combinations thereof.

In aspects, the top metal 908 may connect to the one or more vias 906. Moreover, the one or more vias 906 may connect to the support 102. The one or more vias 906 may be metallic plated holes or metallic filled holes that may function as electrical tunnels through a substrate 920 of the output capacitor IPD 292, which is illustrated in FIG. 6. The one or more vias 906 may comprise a metallic material such as copper, gold, nickel, palladium, silver, and the like, and combinations thereof. The one or more vias 906 may have an axis that may be located in a plane generally perpendicular to the x-axis and/or the z-axis, a plane generally parallel to the y-axis, and/or a plane generally perpendicular to the upper surface 922 of the substrate 920 of the output capacitor IPD 292. Accordingly, the top metal 908 may be electrically connected to the support 102 through the one or more vias 906. In aspects, the top metal 908 may comprise a metallic material such as copper, gold, nickel, palladium, silver, and the like, and combinations thereof.

In aspects, the first connecting metal 910 may connect between the top metal 908 and the DC blocking capacitor 904. In aspects, the first connecting metal 910 may comprise a metallic material such as copper, gold, nickel, palladium, silver, and the like, and combinations thereof. Accordingly, the top metal 908 may be electrically connected to the DC blocking capacitor 904.

In aspects, the second connecting metal 912 may connect between the resistor 902 and the DC blocking capacitor 904. In aspects, the second connecting metal 912 may comprise a metallic material such as copper, gold, nickel, palladium, silver, and the like, and combinations thereof. Accordingly, the resistor 902 may be electrically connected to the DC blocking capacitor 904. Further, the resistor 902 may be electrically connected to the one or more bonding pads 914.

Additionally, the output capacitor IPD 292 may be configured to attach to the support 102. In one aspect, the output capacitor IPD 292 may be configured to directly attach to the support 102.

As illustrated in FIG. 6, the output capacitor IPD 292 may include the resistor 902, the DC blocking capacitor 904, and the one or more bonding pads 914 as described above. Further, the output capacitor IPD 292 may include a substrate 920, a capacitor dielectric material 916, a lower capacitor metal 918, an upper capacitor metal 924, and/or the like.

The substrate 920 may include silicon carbide (SiC). The substrate 920 may be made of Silicon Carbide (SiC). In some aspects, the substrate 920 may be a semi-insulating SiC substrate, a p-type substrate, an n-type substrate, and/or the like. In some aspects, the substrate 920 may be very lightly doped. In one aspect, the substrate 920 may be formed of SiC selected from the group of 6H, 4H, 15R, 3C SiC, or the like. In one aspect, the substrate 920 may be formed of SiC that may be semi-insulating and doped with vanadium or any other suitable dopant or undoped of high purity with defects providing the semi-insulating properties. In other aspects, the substrate 920 may include silicon, Alumina, Aluminum Nitride (AlN), Beryllium oxide (BeO), Titanium Oxide (TiO), metal-oxide substrates, high dielectric metal-oxide substrates, high dielectric substrates, thermally conductive dielectric materials/substrates, a thermally conductive high dielectric material substrate, and/or other similar thermal conductivity performance dielectric material.

The substrate 920 may include an upper surface 922. The upper surface 922 may support the lower capacitor metal 918, the resistor 902, the one or more bonding pads 914, and/or the like.

In the aspect illustrated in FIG. 6, the resistor 902 may be implemented as a thin film resistor. In aspects, the thin film resistor implementation of the resistor 902 may include a sputtered resistive material arranged on the substrate 920. In aspects, the thin film resistor implementation of the resistor 902 may include a sputtered resistive material arranged on the upper surface 922 of the substrate 920.

In the aspect illustrated in FIG. 7, the resistor 902 may be implemented as a bulk resistor. The bulk resistor implementation of the resistor 902 may include a bulk resistor material arranged on the substrate 920. In particular aspects, the bulk resistor implementation of the resistor 902 may include a bulk resistor material arranged on the upper surface 922 of the substrate 920.

As illustrated in FIG. 6 and FIG. 7, the DC blocking capacitor 904 may include the capacitor dielectric material 916, the lower capacitor metal 918, and the upper capacitor metal 924. The lower capacitor metal 918 and/or the upper capacitor metal 924 may comprise a metallic material such as copper, gold, nickel, palladium, silver, and the like, and combinations thereof. The capacitance of the DC blocking capacitor 904 may then be defined by the area of the lower capacitor metal 918, the upper capacitor metal 924, and the thickness and dielectric constant of the capacitor dielectric material 916.

The output capacitor IPD 292 may include a metallization layer 940 located on a lower surface of the substrate 920 opposite the upper surface 922. The metallization layer 940 may be located in a plane generally parallel to the z-axis or a plane generally parallel to the upper surface 922. In one aspect, the metallization layer 940 may be implemented as a full face metallic layer on the lower surface of the substrate 920 opposite the upper surface 922. In aspects, the metallization layer 940 may comprise a metallic material such as copper, gold, nickel, palladium, silver, and the like, and combinations thereof.

Figure 8:
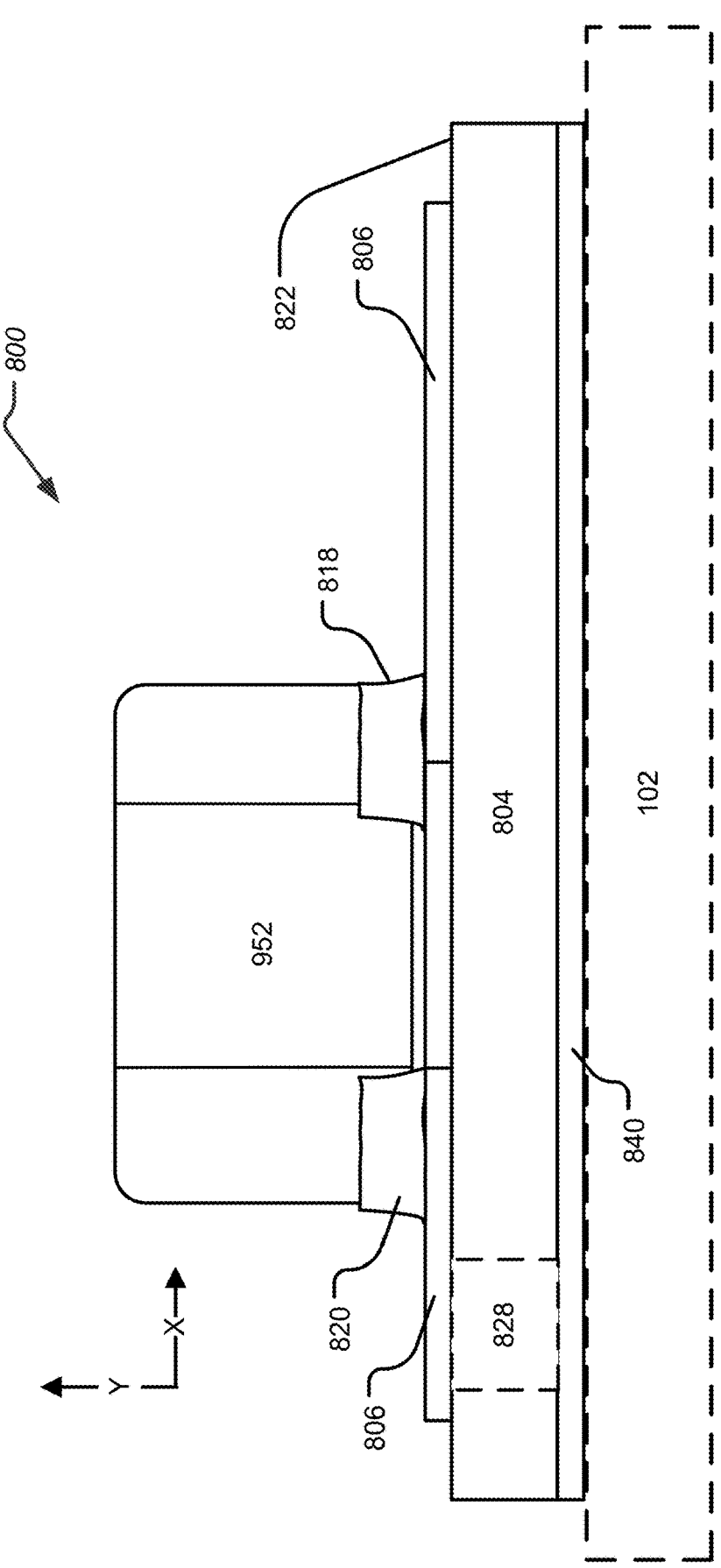
FIG. 8 illustrates a side view of the second IPD component according to the disclosure.

FIG. 8 illustrates a side view of the second IPD component according to the disclosure.

Figure 9:
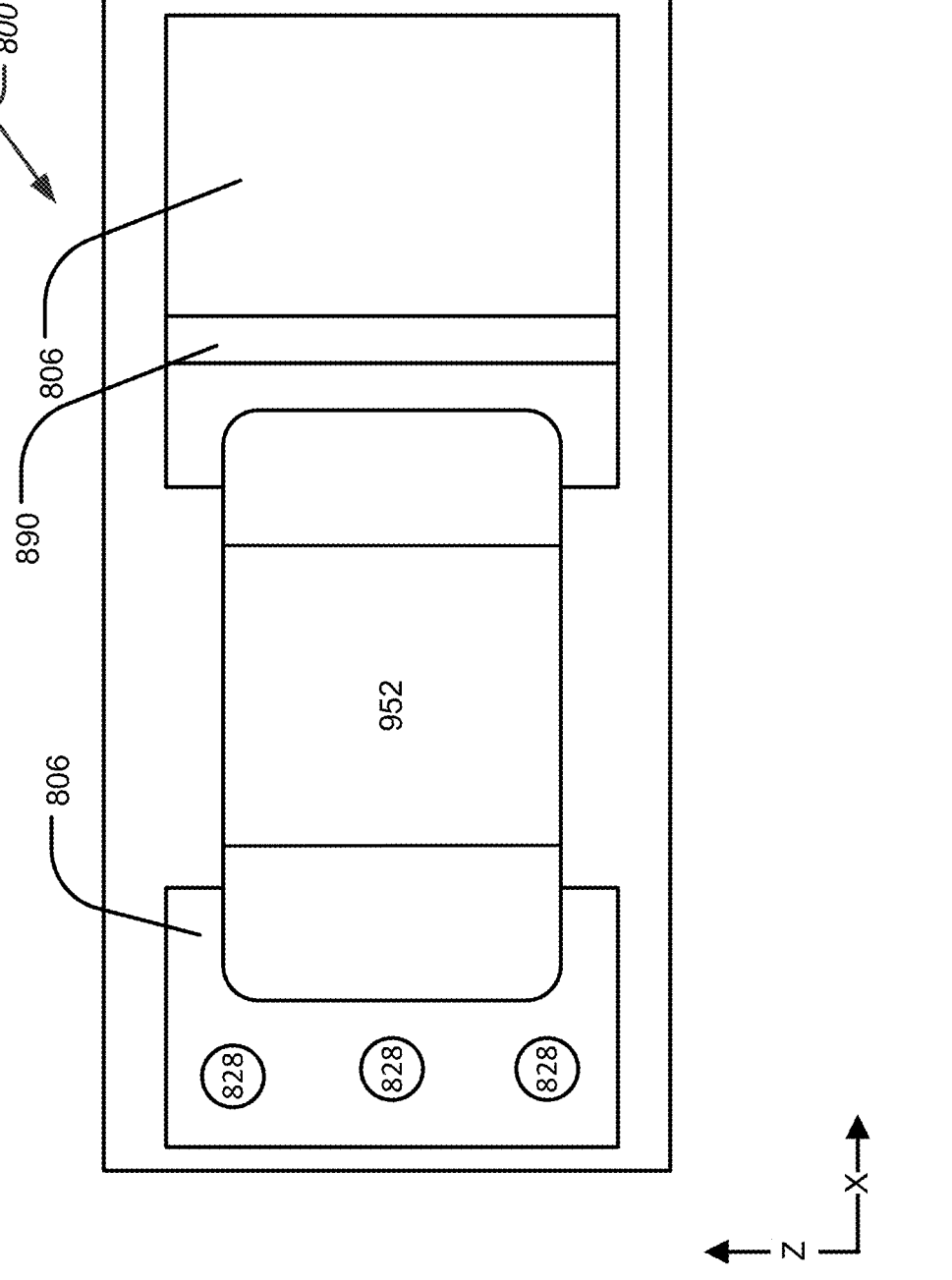
FIG. 9 illustrates a top view of the second IPD component according to FIG. 8.

FIG. 9 illustrates a top view of the second IPD component according to FIG. 8.

In particular, FIG. 8 and FIG. 9 illustrate exemplary implementations of the second IPD component 800 that may include any one or more other features, components, arrangements, and the like as described herein. With reference to FIG. 8, the second IPD component 800 may include a substrate 804, the capacitor 952, a plurality of interconnect pads 806, and/or the like.

The substrate 804 may include silicon carbide (SiC). The substrate 804 may be made of Silicon Carbide (SiC). In some aspects, the substrate 804 may be a semi-insulating SiC substrate, a p-type substrate, an n-type substrate, and/or the like. In some aspects, the substrate 804 may be very lightly doped. In one aspect, the substrate 804 may be formed of SiC selected from the group of 6H, 4H, 15R, 3C SiC, or the like. In one aspect, the substrate 804 may be formed of SiC that may be semi-insulating and doped with vanadium or any other suitable dopant or undoped of high purity with defects providing the semi-insulating properties. In other aspects, the substrate 804 may include silicon, Alumina, Aluminum Nitride (AlN), Beryllium oxide (BeO), Titanium Oxide (TiO), metal-oxide substrates, high dielectric metal-oxide substrates, high dielectric substrates, thermally conductive dielectric materials/substrates, a thermally conductive high dielectric material substrate, and/or other similar thermal conductivity performance dielectric material.

With reference to FIG. 8, the substrate 804 may include an upper surface 822. The upper surface 822 may be located in a plane generally parallel to the x-axis or a plane generally parallel to the upper surface of the support 102. In this regard, generally may be defined to be within 0°-15°, 0°-2°, 2°-4°, 4°-6°, 6°-8°, 8°-10°, 10°-12°, or 12°-15°. The upper surface 822 may support the plurality of interconnect pads 806. The plurality of interconnect pads 806 may include multiple bond pad areas. The plurality of interconnect pads 806 may be formed by a metal surface on the upper surface 822 of the substrate 804 and may comprise a metallic material such as copper, gold, nickel, palladium, silver, and the like, and combinations thereof.

In some aspects, the capacitor 952 may include terminals arranged on a bottom surface. Accordingly, directly mounting a device such as the capacitor 952 to the support 102 of the package 100 would result in a short. For example, the capacitor 952 implemented as a surface mount device (SMD) component, such as a surface mount device (SMD) ceramic capacitor, may include one or more terminals arranged on a bottom surface of the surface mount device (SMD) component. Accordingly, mounting the capacitor 952 configured as a surface mount device (SMD) component to the support 102 of the package 100 would result in a short.

Accordingly, the disclosure utilizes the substrate 804 of the second IPD component 800 to support the capacitor 952. The substrate 804 may be mounted on an upper surface of the support 102. The substrate 804 may be mounted on the upper surface of the support 102 by an adhesive, soldering, sintering, eutectic bonding, ultrasonically welding, and/or the like as described herein. In one aspect, the substrate 804 may be directly mounted on the upper surface of the support 102. In one aspect, the substrate 804 may be mounted on the upper surface of the support 102 with intervening structures, components, and/or the like. The upper surface of the support 102 may be parallel to a z-axis; and the substrate 804 may be arranged vertically above the support 102 along a y-axis as illustrated in FIG. 8. In one aspect, the substrate 804 may be at least partially insulating. More specifically, the substrate 804 may at least partially insulate the capacitor 952 from the support 102.

In one aspect, the one or more of the plurality of interconnect pads 806 may be surfaces for bonding to the one or more interconnects 104. Accordingly, it may be beneficial to ensure that the surfaces of the plurality of interconnect pads 806 remain clean. In particular, attachment of the capacitor 952 to the plurality of interconnect pads 806 may result in solder transferring to other surfaces of the plurality of interconnect pads 806. Accordingly, the plurality of interconnect pads 806 may include a solder barrier 890 arranged between various bond areas of the one or more interconnects 104 to the plurality of interconnect pads 806 and the bond areas of the capacitor 952 to the plurality of interconnect pads 806.

The upper surface 822 may further implement the plurality of interconnect pads 806 as a first terminal bond pad. The first terminal bond pad may be located in a plane generally parallel to the x-axis or a plane generally parallel to the upper surface 822. The first terminal bond pad may connect to a first terminal of the capacitor 952. In this regard, a first connection 820 may be formed between the first terminal bond pad and the first terminal. The first connection 820 may include an adhesive, soldering, sintering, eutectic bonding, ultrasonically welding, and/or the like as described herein. The first terminal bond pad may be formed by a metal surface on the upper surface 822 of the substrate 804 and may comprise a metallic material such as copper, gold, nickel, palladium, silver, and the like, and combinations thereof.

The upper surface 822 may further implement another one of the plurality of interconnect pads 806 as a second terminal bond pad. The second terminal bond pad may be located in a plane generally parallel to the x-axis or a plane generally parallel to the upper surface 822. The second terminal bond pad may connect to a second terminal of the capacitor 952. In this regard, a second connection 818 may be formed between the second terminal bond pad and the second terminal. The second terminal bond pad may be electrically connected in part to the plurality of interconnect pads 806. The second connection 818 may include an adhesive, soldering, sintering, eutectic bonding, ultrasonically welding, and/or the like as described herein. The second terminal bond pad may be formed by a metal surface on the upper surface 822 of the substrate 804 and may comprise a metallic material such as copper, gold, nickel, palladium, silver, and the like, and combinations thereof. Additionally, the upper surface 822 of the substrate 804 may include additional terminals for the capacitor 952 as needed.

The second IPD component 800 may include a metallization layer 840 located on a lower surface of the substrate 804 opposite the upper surface 822. The metallization layer 840 may be located in a plane generally parallel to the x-axis or a plane generally parallel to the upper surface 822. In one aspect, the metallization layer 840 may be implemented as a full face metallic layer on the lower surface of the substrate 804 opposite the upper surface 822.

Additionally, the second IPD component 800 may include vias 828. The vias 828 may extend from the plurality of interconnect pads 806 to the metallization layer 840. Accordingly, a terminal of the capacitor 952 may connect through the first connection 820 to the first terminal bond pad through the vias 828 at least to the metallization layer 840 to make an electrical connection and/or electrical contact with the support 102. The vias 828 may also extend through the metallization layer 840 to the support 102 to make an electrical connection and/or electrical contact with the support 102. In other aspects, the vias 828 may only be implemented as partial vias. The vias 828 may be metallic plated holes or metallic filled holes that may function as electrical tunnels through the substrate 804. The vias 828 may comprise a metallic material such as copper, gold, nickel, palladium, silver, and the like, and combinations thereof. The vias 828 may have an axis that may be located in a plane generally perpendicular to the x-axis, a plane generally parallel to the z-axis, and/or a plane generally perpendicular to the upper surface 822.

In one aspect, the second IPD component 800 may be configured to attach to the support 102. In one aspect, the second IPD component 800 may be configured to directly attached to the support 102.

Figure 10:
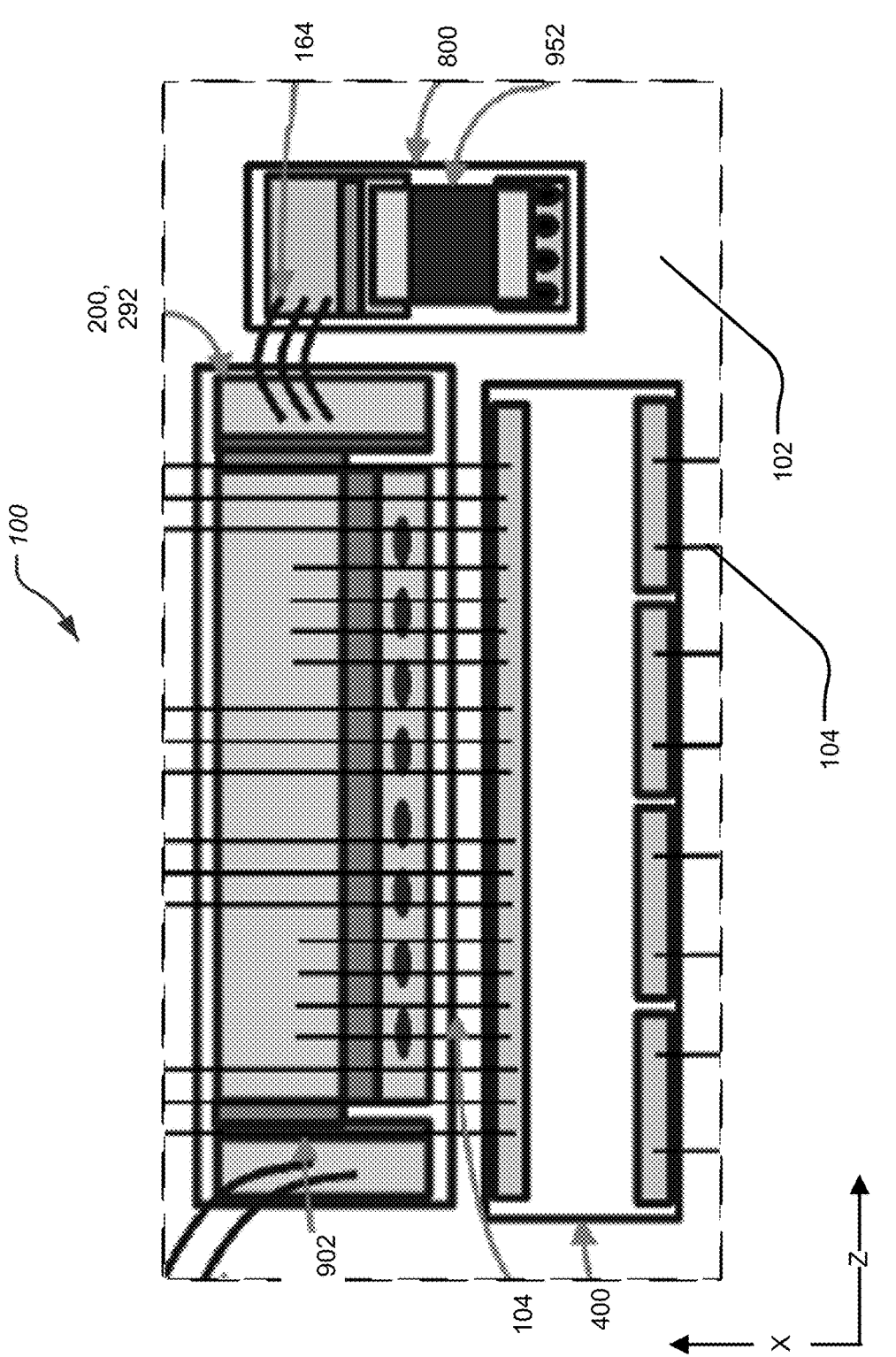
FIG. 10 illustrates a partial top view of the package according to an aspect of the disclosure.

FIG. 10 illustrates a partial top view of the package according to an aspect of the disclosure.

In particular, FIG. 10 show exemplary implementations of the package 100 that may include any one or more other features, components, arrangements, and the like as described herein. Referring to FIG. 10, the package 100 may include the output capacitor IPD 292, the second IPD component 800, the one or more semiconductor devices 400, and/or the like. Moreover, the output capacitor IPD 292, the second IPD component 800, the one or more semiconductor devices 400, and/or the like may be arranged on the support 102. Additional connections between the one or more semiconductor devices 400 and the output capacitor IPD 292 are not shown for ease of illustration and understanding.

In aspects, the package 100 may include one or more shunt interconnects 164 between the second IPD component 800 and the output capacitor IPD 292. In particular, the one or more shunt interconnects 164 may connect the capacitor 952 of the second IPD component 800 with the resistor 902 of the output capacitor IPD 292. In particular aspects, the one or more shunt interconnects 164 may connect to the plurality of interconnect pads 806 of the second IPD component 800; and the one or more shunt interconnects 164 may connect to one implementation of the one or more bonding pads 914 of the output capacitor IPD 292. Additionally, the construction of the one or more shunt interconnects 164 may be implemented consistent with the construction of the one or more interconnects 104.

FIG. 10 further illustrates that the package 100 may include the one or more interconnects 104 connecting between the output capacitor IPD 292, the one or more semiconductor devices 400, and other components of the package 100. In particular aspects, implementations of the one or more interconnects 104 may connect between the one or more semiconductor devices 400 and t the DC blocking capacitor 904 of the output capacitor IPD 292.

Figure 11:
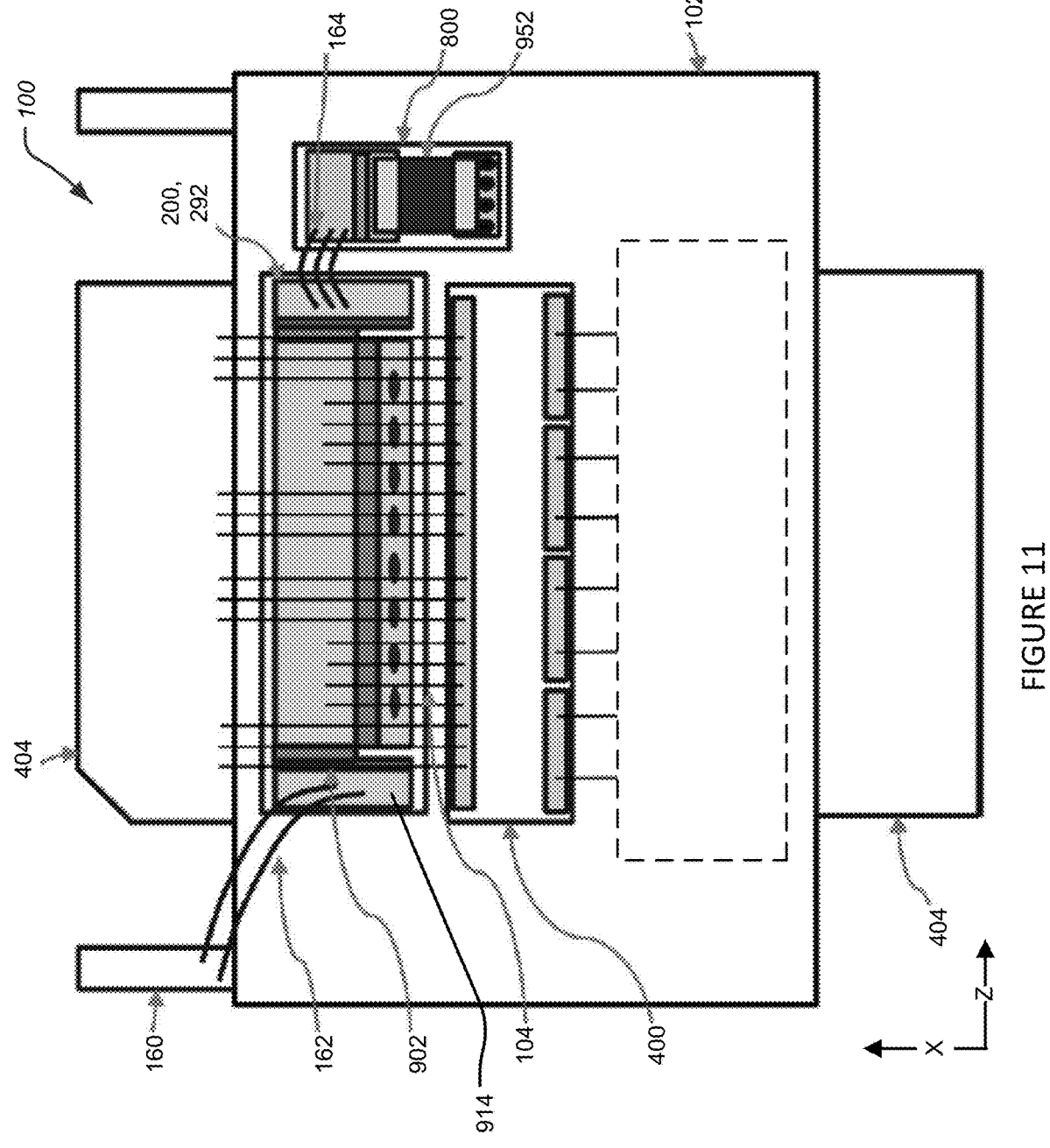
FIG. 11 illustrates a partial top view of the package according to aspects of the disclosure.

FIG. 11 illustrates a partial top view of the package according to aspects of the disclosure.

In particular, FIG. 11 show exemplary implementations of the package 100 that may include any one or more other features, components, arrangements, and the like as described herein. As illustrated in FIG. 11, aspects the package 100 may include a package baseband lead 160, a baseband bonding wire 162, and/or the like. In aspects, the baseband bonding wire 162 may connect between one implementation of the one or more bonding pads 914 and the package baseband lead 160. The construction of the baseband bonding wire 162 may be consistent with the construction of the package 100 for as described herein. Additionally, further aspects of the package 100 are not illustrated for ease of illustration and understanding.

Figure 12:
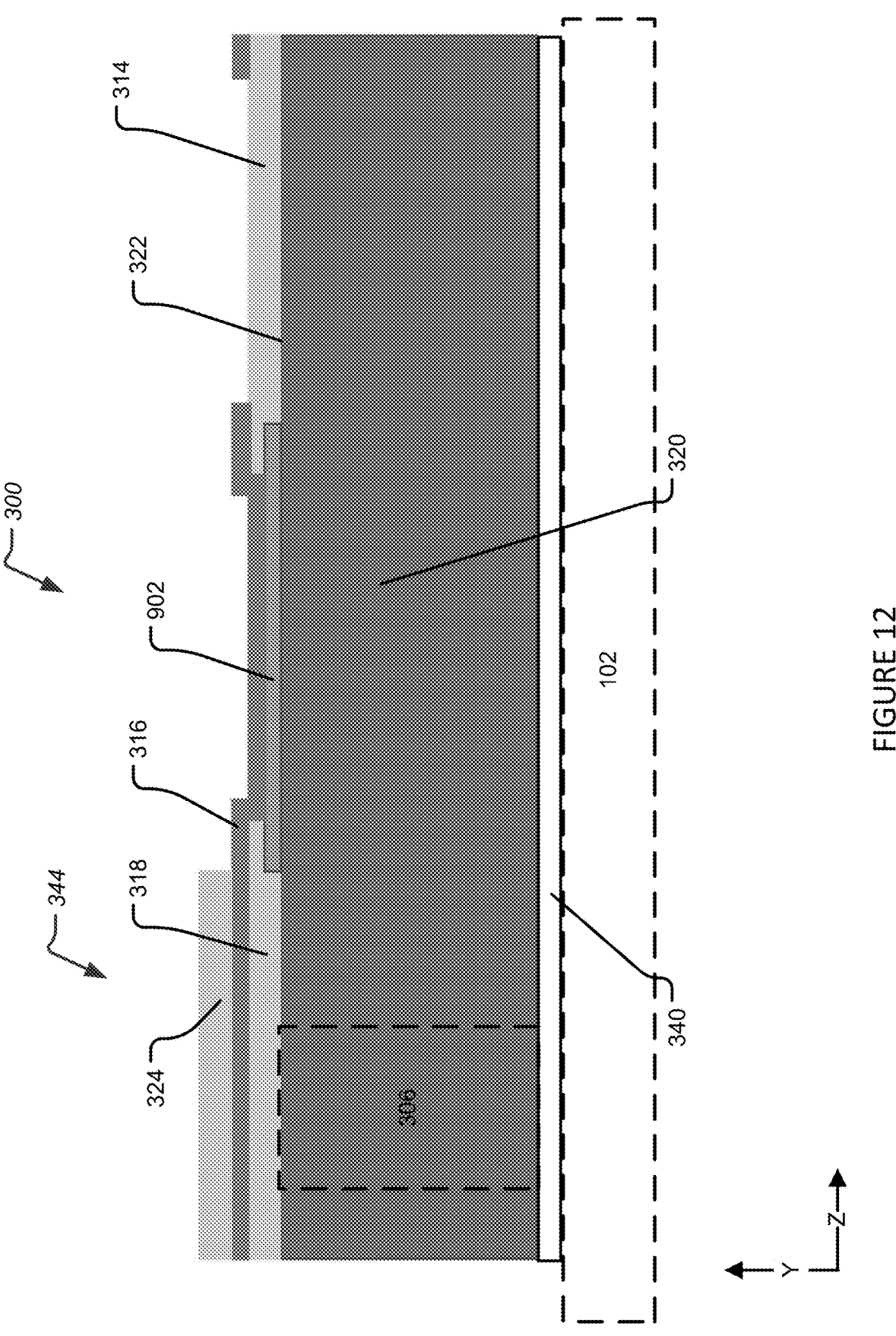
FIG. 12 illustrates a cross-sectional view of an implementation of the third IPD component according to aspects of the disclosure.

FIG. 12 illustrates a cross-sectional view of an implementation of the third IPD component according to aspects of the disclosure.

Figure 13:
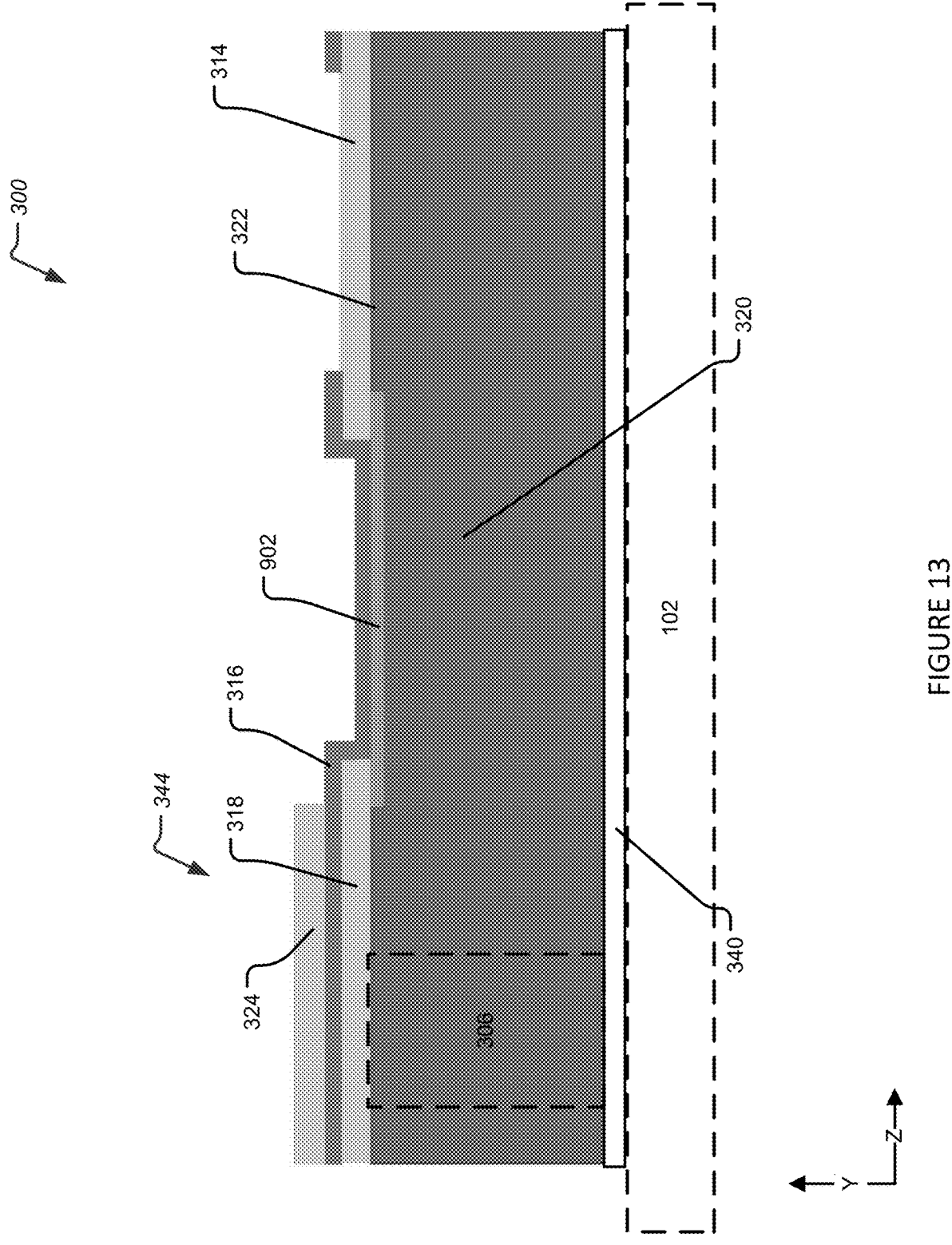
FIG. 13 illustrates a cross-sectional view of another implementation of the third IPD component according to aspects of the disclosure.

FIG. 13 illustrates a cross-sectional view of another implementation of the third IPD component according to aspects of the disclosure.

In particular, FIG. 12 and FIG. 13 show an implementation of the third IPD component 300 that may include any one or more other features, components, arrangements, and the like as described herein. Referring to FIG. 12, in one aspect, the third IPD component 300 may include the resistor 902, a bonding pad 314, one or more vias 306, a capacitor 344, a lower capacitor metal 318, an upper capacitor metal 324, and/or the like.

In aspects, the bonding pad 314 may be configured as a connection between the third IPD component 300 and the capacitor 952. The connection may include implementations of the one or more interconnects 104 and/or implementations of the one or more shunt interconnects 164; and the connection may include implementations of adhesive, soldering, sintering, eutectic bonding, ultrasonically welding, and/or the like as described herein. In aspects, the bonding pad 314 may be configured as a wire bonding pad for connecting to the capacitor 952. Accordingly, the bonding pad 314 may provide an electrical connection to the capacitor 952. In aspects, the bonding pad 314 may comprise a metallic material such as copper, gold, nickel, palladium, silver, and the like, and combinations thereof. In aspects, the upper capacitor metal 324 may provide an electrical connection to the one or more bonding pads 914 of the output capacitor IPD 292.

The one or more vias 306 may be metallic plated holes or metallic filled holes that may function as electrical tunnels through a substrate 320 of the third IPD component 300, which is illustrated in FIG. 12. The one or more vias 306 may comprise a metallic material such as copper, gold, nickel, palladium, silver, and the like, and combinations thereof. The one or more vias 306 may have an axis that may be located in a plane generally perpendicular to the x-axis and/or the z-axis, a plane generally parallel to the y-axis, and/or a plane generally perpendicular to the upper surface 322 of the third IPD component 300. Accordingly, the lower capacitor metal 318 may be electrically connected to the support 102 through the one or more vias 306. In aspects, the lower capacitor metal 318 may comprise a metallic material such as copper, gold, nickel, palladium, silver, and the like, and combinations thereof.

Additionally, the third IPD component 300 may be configured to attach to the support 102. In one aspect, the third IPD component 300 may be configured to directly attach to the support 102.

The substrate 320 may include silicon carbide (SiC). The substrate 320 may be made of Silicon Carbide (SiC). In some aspects, the substrate 320 may be a semi-insulating SiC substrate, a p-type substrate, an n-type substrate, and/or the like. In some aspects, the substrate 320 may be very lightly doped. In one aspect, the substrate 320 may be formed of SiC selected from the group of 6H, 4H, 15R, 3C SiC, or the like. In one aspect, the substrate 320 may be formed of SiC that may be semi-insulating and doped with vanadium or any other suitable dopant or undoped of high purity with defects providing the semi-insulating properties. In other aspects, the substrate 320 may include silicon, Alumina, Aluminum Nitride (AlN), Beryllium oxide (BeO), Titanium Oxide (TiO), metal-oxide substrates, high dielectric metal-oxide substrates, high dielectric substrates, thermally conductive dielectric materials/substrates, a thermally conductive high dielectric material substrate, and/or other similar thermal conductivity performance dielectric material.

The substrate 320 may include an upper surface 322. The upper surface 322 may support the lower capacitor metal 318, the resistor 902, the bonding pad 314, and/or the like.

In the aspect illustrated in FIG. 12, the resistor 902 may be implemented as a thin film resistor. In aspects, the thin film resistor implementation of the resistor 902 may include a sputtered resistive material arranged on the substrate 320. In aspects, the thin film resistor implementation of the resistor 902 may include a sputtered resistive material arranged on the upper surface 322 of the substrate 320.

In the aspect illustrated in FIG. 13, the resistor 902 may be implemented as a bulk resistor. The bulk resistor implementation of the resistor 902 may include a bulk resistor material arranged on the substrate 320. In particular aspects, the bulk resistor implementation of the resistor 902 may include a bulk resistor material arranged on the upper surface 322 of the substrate 320.

As illustrated in FIG. 12 and FIG. 13, the capacitor 344 may include the capacitor dielectric material 316, the lower capacitor metal 318, and the upper capacitor metal 324. The lower capacitor metal 318 and/or the upper capacitor metal 324 may comprise a metallic material such as copper, gold, nickel, palladium, silver, and the like, and combinations thereof. The capacitance of the capacitor 344 may then be defined by the area of the lower capacitor metal 318, the upper capacitor metal 324, and the thickness and dielectric constant of the capacitor dielectric material 316.

The third IPD component 300 may include a metallization layer 340 located on a lower surface of the substrate 320 opposite the upper surface 322. The metallization layer 340 may be located in a plane generally parallel to the z-axis or a plane generally parallel to the upper surface 322. In one aspect, the metallization layer 340 may be implemented as a full face metallic layer on the lower surface of the substrate 320 opposite the upper surface 322. In aspects, the metallization layer 340 may comprise a metallic material such as copper, gold, nickel, palladium, silver, and the like, and combinations thereof.

Figure 14:
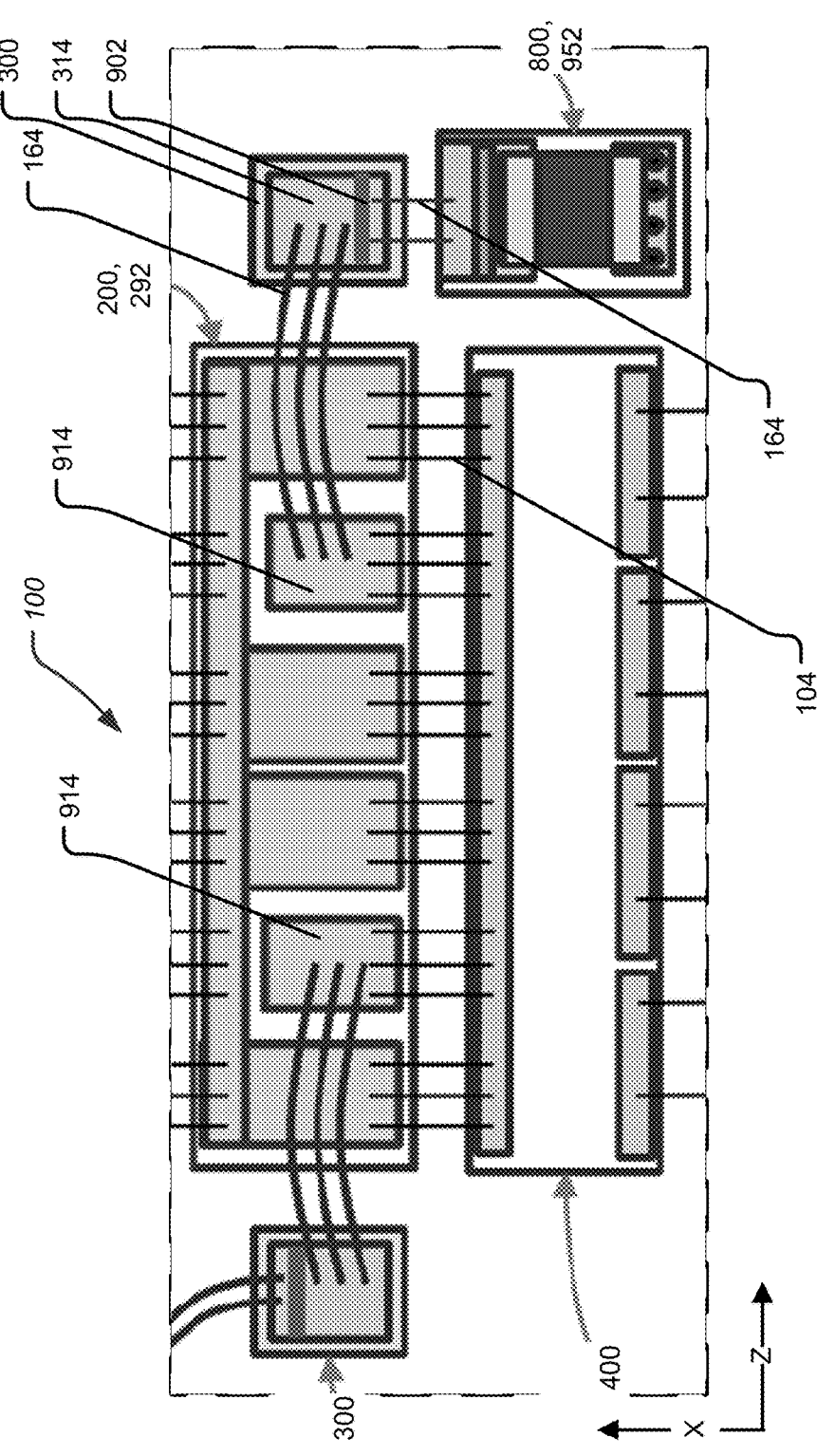
FIG. 14 illustrates a partial top view of the package according to an aspect of the disclosure.

FIG. 14 illustrates a partial top view of the package according to an aspect of the disclosure.

In particular, FIG. 14 show exemplary implementations of the package 100 that may include any one or more other features, components, arrangements, and the like as described herein. Referring to FIG. 14, the package 100 may include the output capacitor IPD 292, the second IPD component 800, the third IPD component 300, the one or more semiconductor devices 400, and/or the like. Moreover, the output capacitor IPD 292, the second IPD component 800, the one or more semiconductor devices 400, the third IPD component 300, and/or the like may be arranged on the support 102. Additional connections between the one or more semiconductor devices 400, the output capacitor IPD 292, and other components of the package 100 are not shown for ease of illustration and understanding.

In aspects, the package 100 may include one or more shunt interconnects 164 between the second IPD component 800 and the third IPD component 300. In aspects, the package 100 may include one or more shunt interconnects 164 between the third IPD component 300 and the output capacitor IPD 292. In particular, the one or more shunt interconnects 164 may connect the capacitor 952 of the second IPD component 800 with the resistor 902 of the third IPD component 300. FIG. 14 further illustrates that the package 100 may include the one or more interconnects 104 connecting between the output capacitor IPD 292 and the one or more semiconductor devices 400.

Figure 15:
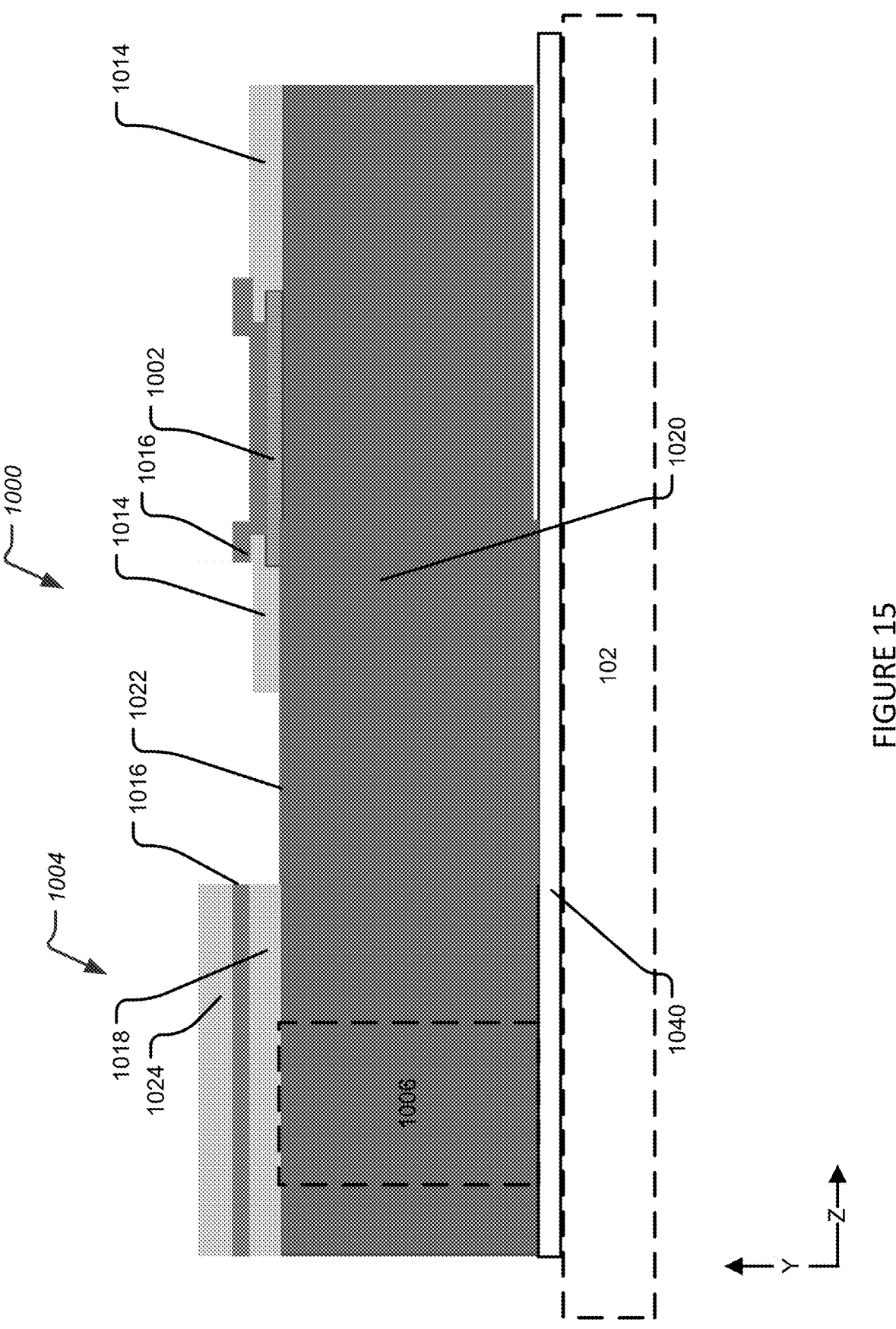
FIG. 15 illustrates a cross-sectional view of an implementation of the fourth IPD component according to aspects of the disclosure.

FIG. 15 illustrates a cross-sectional view of an implementation of the fourth IPD component according to aspects of the disclosure.

Figure 16:
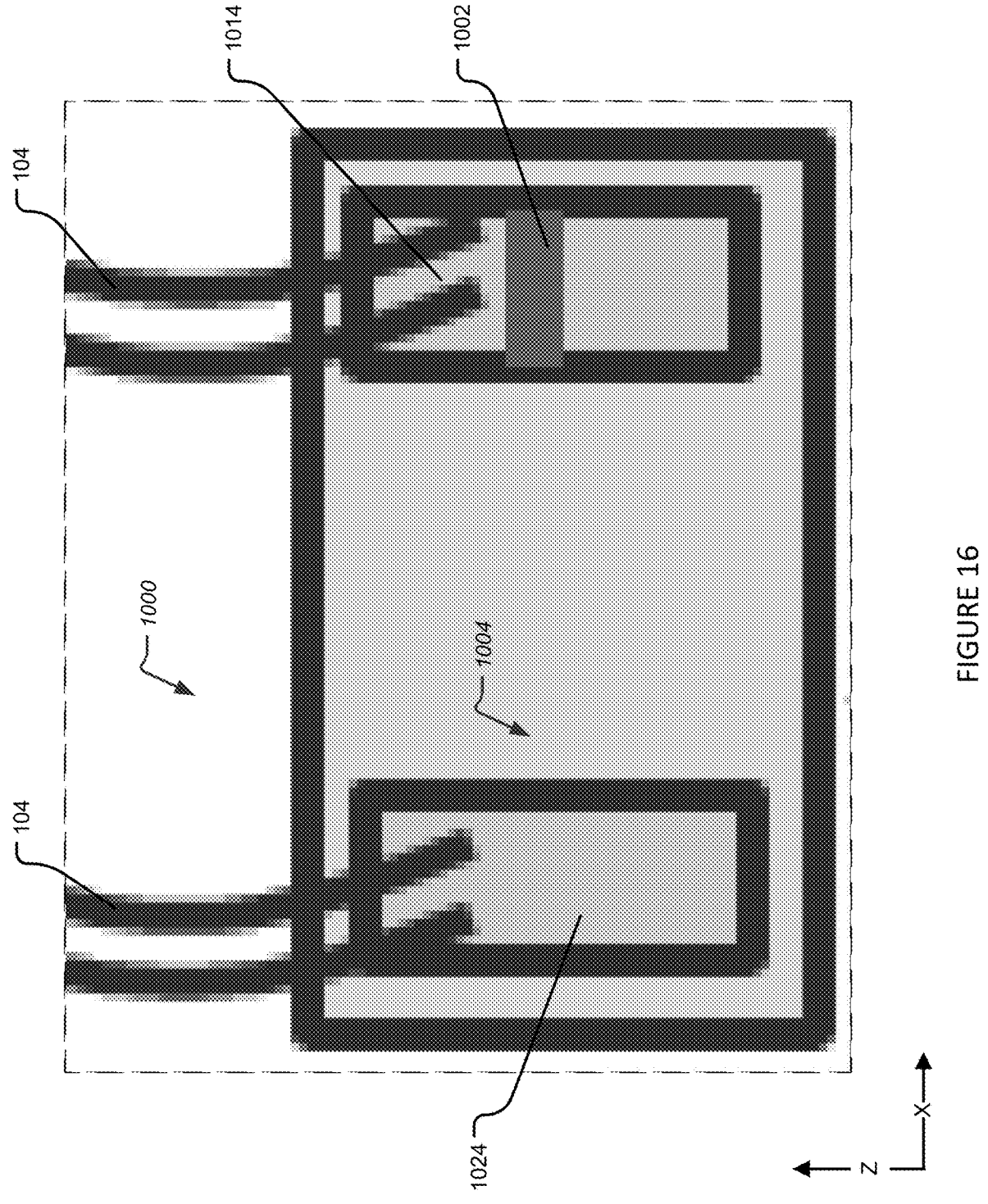
FIG. 16 illustrates a top view of the fourth IPD component according to FIG. 15.

FIG. 16 illustrates a top view of the fourth IPD component according to FIG. 15.

In particular, FIG. 15 and FIG. 16 show an implementation of the fourth IPD component 1000 that may include any one or more other features, components, arrangements, and the like as described herein. Referring to FIG. 15, in one aspect, the fourth IPD component 1000 may include a resistor 1002, a bonding pad 1014, one or more vias 1006, a capacitor 1004, and/or the like.

In aspects, the bonding pad 1014 may be configured as a connection between the fourth IPD component 1000 and an input network 294. The connection may include implementations of the one or more interconnects 104; and the connection may include implementations of adhesive, soldering, sintering, eutectic bonding, ultrasonically welding, and/or the like as described herein. In aspects, the bonding pad 1014 may be configured as a wire bonding pad for connecting the fourth IPD component 1000 to the input network 294. Accordingly, the bonding pad 1014 may provide an electrical connection from the fourth IPD component 1000 to the input network 294. In aspects, the bonding pad 1014 may comprise a metallic material such as copper, gold, nickel, palladium, silver, and the like, and combinations thereof. In aspects, the upper capacitor metal 1024 may be configured as a wire bonding pad for connecting the fourth IPD component 1000 to the input network 294. Accordingly, the upper capacitor metal 1024 may provide an electrical connection from the fourth IPD component 1000 to the input network 294. In aspects, the upper capacitor metal 1024 may comprise a metallic material such as copper, gold, nickel, palladium, silver, and the like, and combinations thereof.

The one or more vias 1006 may be metallic plated holes or metallic filled holes that may function as electrical tunnels through a substrate 1020 of the fourth IPD component 1000, which is illustrated in FIG. 15. The one or more vias 1006 may comprise a metallic material such as copper, gold, nickel, palladium, silver, and the like, and combinations thereof. The one or more vias 1006 may have an axis that may be located in a plane generally perpendicular to the x-axis and/or the z-axis, a plane generally parallel to the y-axis, and/or a plane generally perpendicular to the upper surface 1022 of the fourth IPD component 1000. Accordingly, a lower capacitor metal 1018 may be electrically connected to the support 102 through the one or more vias 1006. In aspects, the lower capacitor metal 1018 may comprise a metallic material such as copper, gold, nickel, palladium, silver, and the like, and combinations thereof.

Additionally, the fourth IPD component 1000 may be configured to attach to the support 102. In one aspect, the fourth IPD component 1000 may be configured to directly attach to the support 102.

The substrate 1020 may include silicon carbide (SiC). The substrate 1020 may be made of Silicon Carbide (SiC). In some aspects, the substrate 1020 may be a semi-insulating SiC substrate, a p-type substrate, an n-type substrate, and/or the like. In some aspects, the substrate 1020 may be very lightly doped. In one aspect, the substrate 1020 may be formed of SiC selected from the group of 6H, 4H, 15R, 3C SiC, or the like. In one aspect, the substrate 1020 may be formed of SiC that may be semi-insulating and doped with vanadium or any other suitable dopant or undoped of high purity with defects providing the semi-insulating properties. In other aspects, the substrate 1020 may include silicon, Alumina, Aluminum Nitride (AlN), Beryllium oxide (BeO), Titanium Oxide (TiO), metal-oxide substrates, high dielectric metal-oxide substrates, high dielectric substrates, thermally conductive dielectric materials/substrates, a thermally conductive high dielectric material substrate and/or other similar thermal conductivity performance dielectric material.

The substrate 1020 may include an upper surface 1022. The upper surface 1022 may support the lower capacitor metal 1018, the resistor 1002, the bonding pad 1014, and/or the like.

In the aspect illustrated in FIG. 15, the resistor 1002 may be implemented as a thin film resistor. In aspects, the thin film resistor implementation of the resistor 1002 may include a sputtered resistive material arranged on the substrate 1020. In aspects, the thin film resistor implementation of the resistor 1002 may include a sputtered resistive material arranged on the upper surface 1022 of the substrate 1020.

In other aspects, the resistor 1002 may be implemented as a bulk resistor. The bulk resistor implementation of the resistor 1002 may include a bulk resistor material arranged on the substrate 1020. In particular aspects, the bulk resistor implementation of the resistor 1002 may include a bulk resistor material arranged on the upper surface 1022 of the substrate 1020.

As illustrated in FIG. 15, the capacitor 1004 may include the capacitor dielectric material 1016, the lower capacitor metal 1018, and an upper capacitor metal 1024. The lower capacitor metal 1018 and/or the upper capacitor metal 1024 may comprise a metallic material such as copper, gold, nickel, palladium, silver, and the like, and combinations thereof. The capacitance of the capacitor 1004 may then be defined by the area of the lower capacitor metal 1018, the upper capacitor metal 1024, and the thickness and dielectric constant of the capacitor dielectric material 1016.

The fourth IPD component 1000 may include a metallization layer 1040 located on a lower surface of the substrate 1020 opposite the upper surface 1022. The metallization layer 1040 may be located in a plane generally parallel to the z-axis or a plane generally parallel to the upper surface 1022. In one aspect, the metallization layer 1040 may be implemented as a full face metallic layer on the lower surface of the substrate 1020 opposite the upper surface 1022. In aspects, the metallization layer 1040 may comprise a metallic material such as copper, gold, nickel, palladium, silver, and the like, and combinations thereof.

Figure 17:
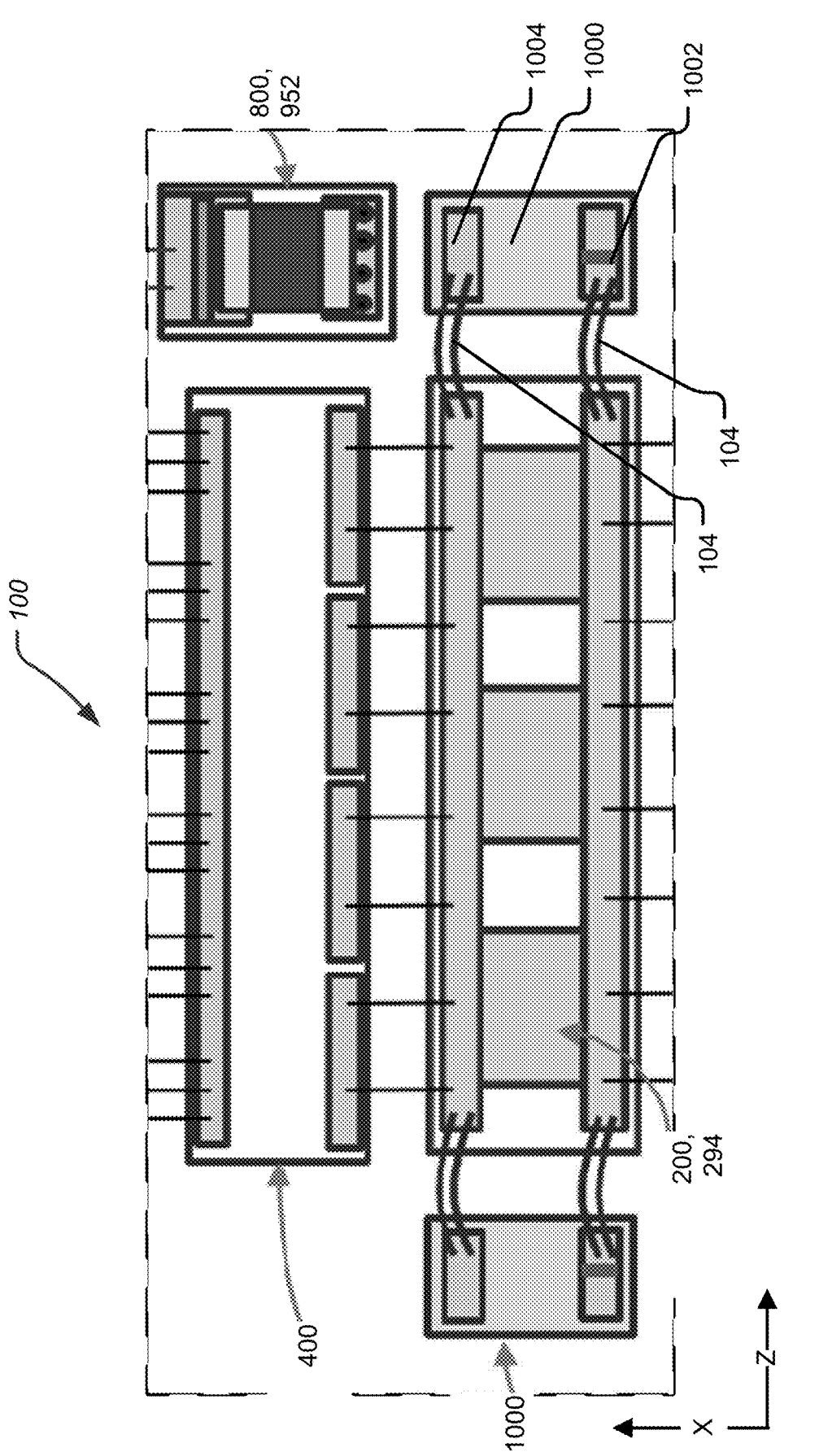
FIG. 17 illustrates a partial top view of the package according to an aspect of the disclosure.

FIG. 17 illustrates a partial top view of the package according to an aspect of the disclosure.

In particular, FIG. 17 show exemplary implementations of the package 100 that may include any one or more other features, components, arrangements, and the like as described herein. Referring to FIG. 17, the package 100 may include the fourth IPD component 1000 and the input network 294.

In aspects, the capacitor 1004 of the fourth IPD component 1000 may connect to the input network 294 with an implementation of the one or more interconnects 104. In aspects, the resistor 1002 of the fourth IPD component 1000 may connect the input network 294 through an implementation of the one or more interconnects 104. In aspects, the resistor 1002 of the fourth IPD component 1000 may connect the input network 294 through an implementation of the one or more interconnects 104 connecting to the bonding pad 1014 of the fourth IPD component 1000.

In aspects, the capacitor 1004 of the fourth IPD component 1000 may connect the input network 294 through an implementation of the one or more interconnects 104. In aspects, the capacitor 1004 of the fourth IPD component 1000 may connect the input network 294 through an implementation of the one or more interconnects 104 connecting to the upper capacitor metal 1024 of the fourth IPD component 1000.

The input network 294 may be implemented as an implementation of the first IPD component 200. Accordingly, the input network 294 may include any one or more of the components thereof. Moreover, the input network 294 may include further components as needed for implementation in the package 100.

Figure 18:
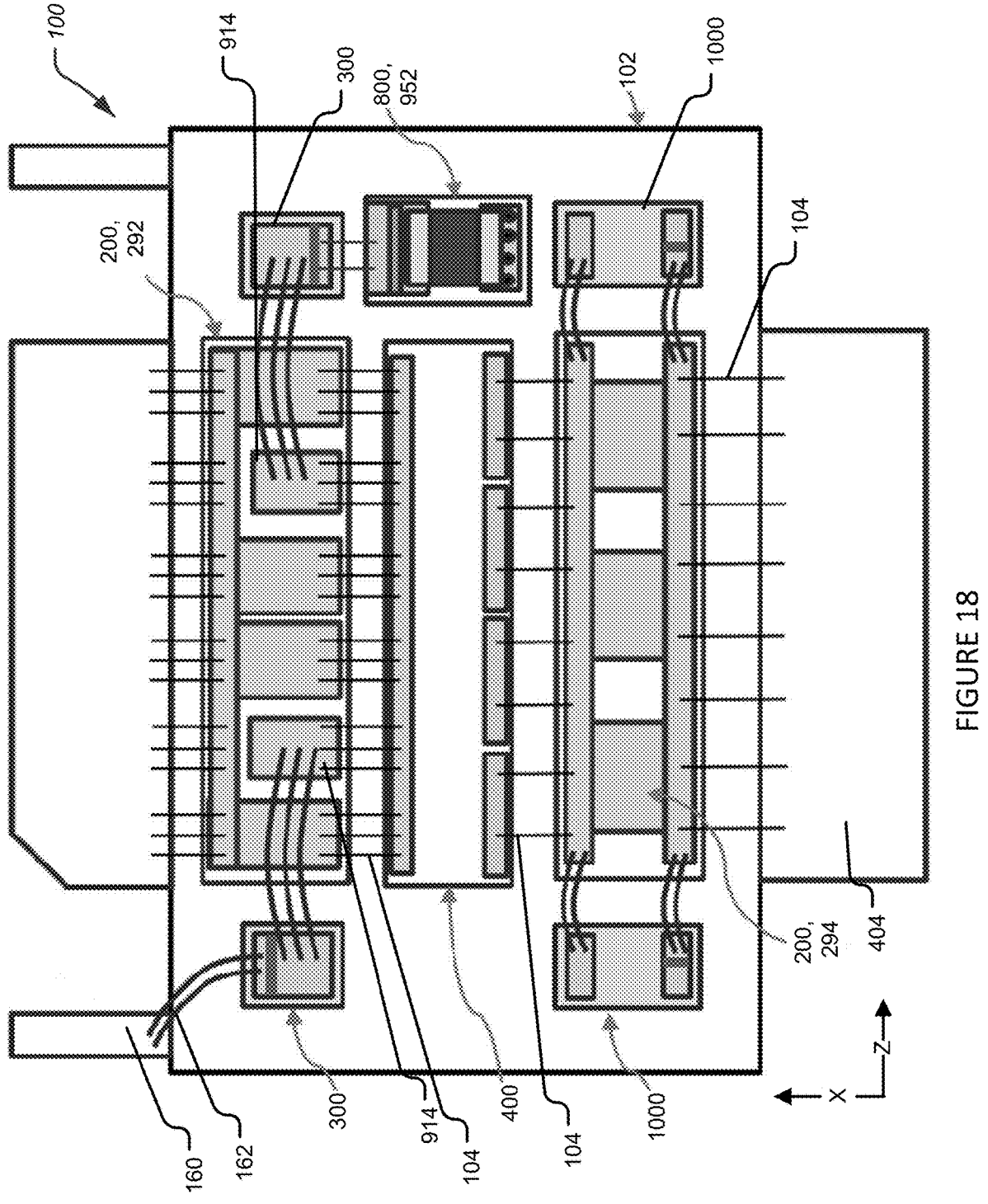
FIG. 18 illustrates a partial top view of the package according to an aspect of the disclosure.

FIG. 18 illustrates a partial top view of the package according to an aspect of the disclosure.

In particular, FIG. 18 shows exemplary implementations of the package 100 that may include any one or more other features, components, arrangements, and the like as described herein. In particular, FIG. 18 illustrates the package 100 implementing the output capacitor IPD 292, the third IPD component 300, the second IPD component 800, the input network 294, the fourth IPD component 1000, and/or the like.

The package 100 may be implemented in any number of different applications. In this regard, the package 100 may be implemented in applications implementing high video bandwidth power amplifier transistors, a single path radio frequency power transistor, a single stage radio frequency power transistor, a multipath radio frequency power transistor, a Doherty configuration a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The package 100 may be implemented as a power package. The package 100 may be implemented as a power package and may implement applications and components as described herein.

The package 100 may be implemented as a radio frequency package. The package 100 may be implemented as a radio frequency package and may implement applications and components as described herein. The package 100 implemented as a radio frequency package may include, connect, support, or the like a transmitter, transmitter functions, a receiver, receiver functions, a transceiver, transceiver functions, and the like. The package 100 implemented as a radio frequency package may be configured to, may support, or the like transmitting a radio wave and modulating that wave to carry data with allowable transmitter power output, harmonics, and/or band edge requirements. The package 100 implemented as a radio frequency package may be configured to, may support, or the like receiving a radio wave and demodulating the radio wave. The package 100 implemented as a radio frequency package may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

The first IPD component 200, the second IPD component 800, the third IPD component 300, and/or the fourth IPD component 1000 may include any electrical component for any application. In aspects, the one or more semiconductor devices 400 of the package 100 may be high video bandwidth power amplifier transistors, a single path radio frequency power transistor, a single stage radio frequency power transistor, a multipath radio frequency power transistor, a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like.

Figure 19:
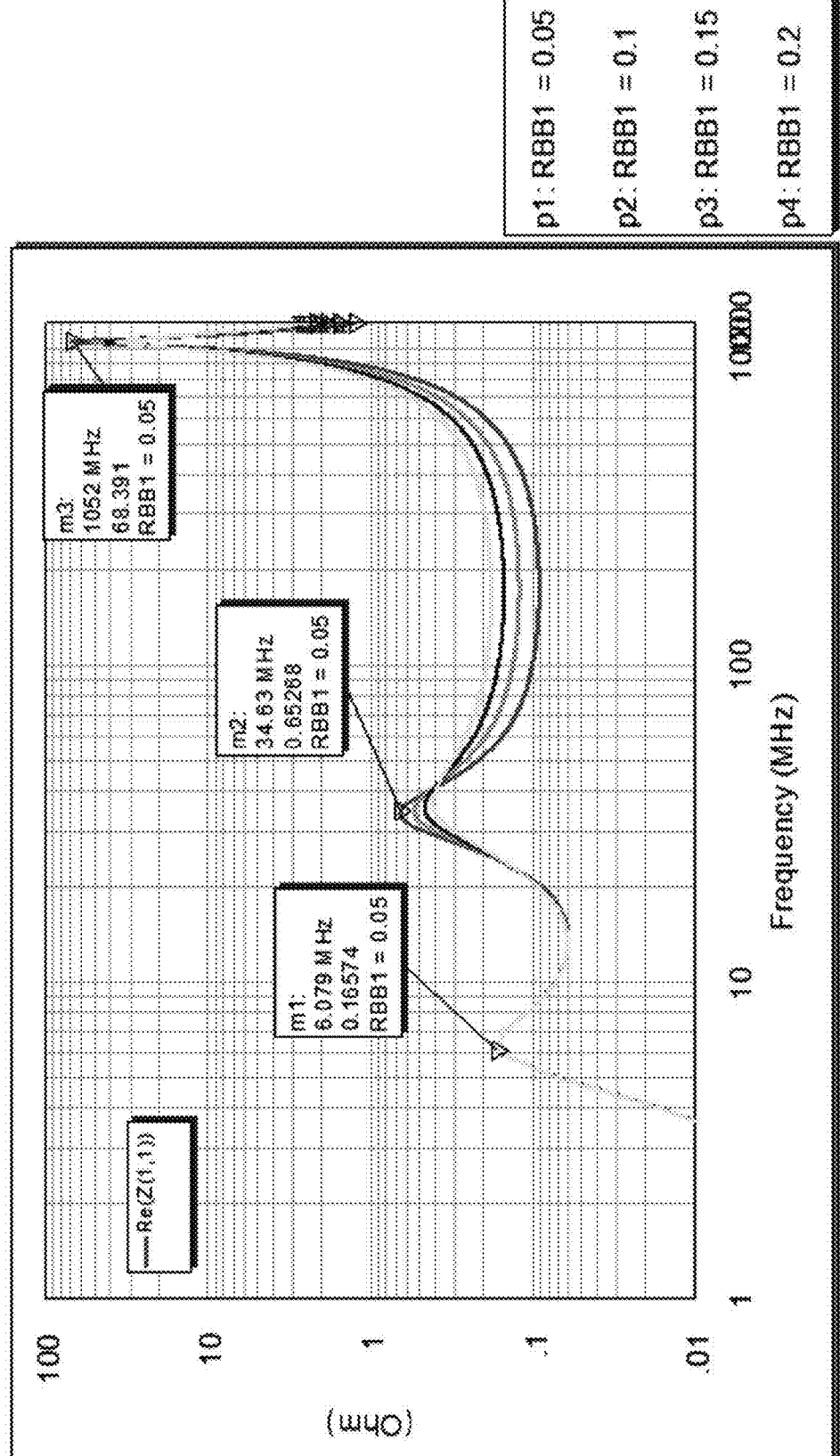
FIG. 19 illustrates simulated results showing a baseband impedance suppress effect of implementing the resistor as disclosed.

FIG. 19 illustrates simulated results showing a baseband impedance suppress effect of implementing the resistor as disclosed.

In particular, FIG. 19 illustrates simulated results showing a baseband impedance suppress effect of implementing the resistor 902 in the package 100 as disclosed. In this regard, a resistance of the resistor 902 was varied from 0.05 Ohm to 0.2 Ohm (RBB2) and the simulated results illustrated in FIG. 19 clearly show the suppression effect of the second peak of the baseband impedance in comparison to the simulated results without implementation of the resistor 902 illustrated in FIG. 25.

Figure 20:
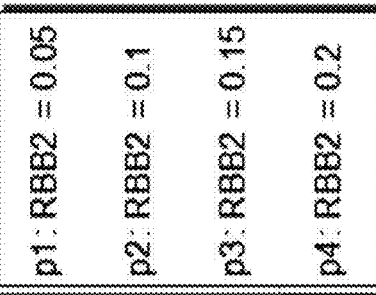
FIG. 20 illustrates simulated results showing a baseband impedance suppress effect of implementing the resistor as disclosed.

FIG. 20 illustrates simulated results showing a baseband impedance suppress effect of implementing the resistor as disclosed.

In particular, FIG. 20 illustrates simulated results showing a baseband impedance suppress effect of implementing the resistor 902 in the package 100 as disclosed. In this regard, a resistance of the resistor 902 was varied from 0.05 Ohm to 0.2 Ohm (RBB2) and the simulated results illustrated in FIG. 19 clearly show the suppression effect of the first peak of the baseband impedance in comparison to the simulated results without implementation of the resistor 902 illustrated in FIG. 25.

Figure 21:
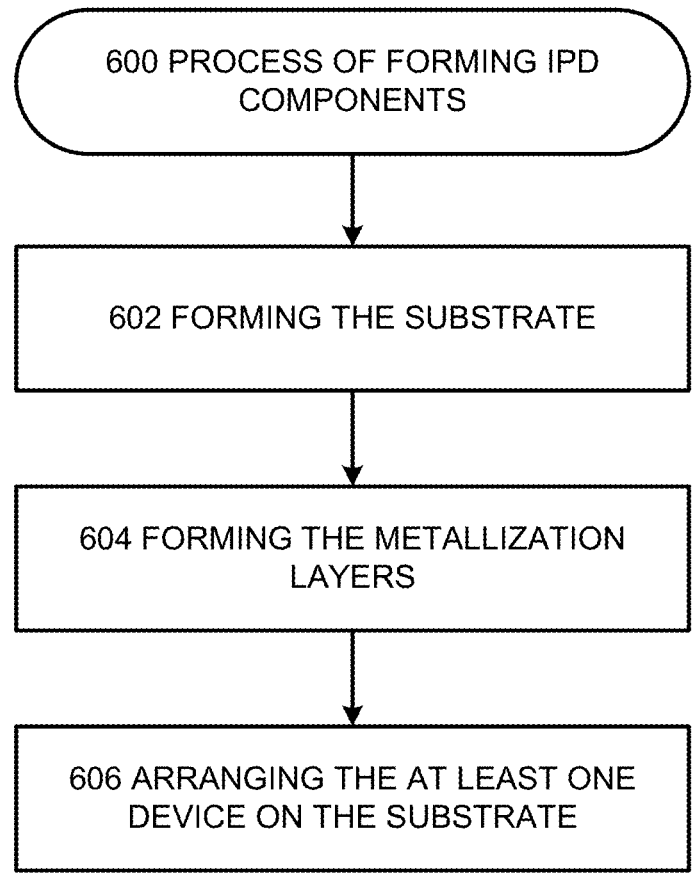
FIG. 21 shows a process of making IPD components according to the disclosure.

FIG. 21 shows a process of making IPD components according to the disclosure.

In particular, FIG. 21 illustrates a process of forming IPD components 600 that relates to the first IPD component 200, the second IPD component 800, the third IPD component 300, and/or the fourth IPD component 1000, as described herein. It should be noted that the aspects of the process of forming IPD components 600 may be performed in a different order consistent with the aspects described herein. Additionally, it should be noted that portions of the process of forming IPD components 600 may be performed in a different order consistent with the aspects described herein. Moreover, the process of forming IPD components 600 may be modified to have more or fewer processes consistent with the various aspects disclosed herein. Additionally, the process of forming IPD components 600 may include any other aspects of the disclosure described herein.

Initially, the process of forming IPD components 600 may include a process of forming the substrate 602. More specifically, the substrate 920, the substrate 320, the substrate 804, and/or the substrate 1020 may be constructed, configured, and/or arranged as described herein. Additionally, the one or more vias 906 may be formed in the substrate 920, the one or more vias 306 may be formed in the substrate 320, the vias 828 may be formed in the substrate 804, and/or the one or more vias 1006 may be formed in the substrate 1020.

Further, the process of forming IPD components 600 may include forming the metallization layer 604. More specifically, the metallization layer 940 may be constructed, configured, and/or arranged as described herein on at least a portion of the substrate 920; the metallization layer 340 may be constructed, configured, and/or arranged as described herein on at least a portion of the substrate 320; the metallization layer 840 may be constructed, configured, and/or arranged as described herein on at least a portion of the substrate 804; and/or the metallization layer 1040 may be constructed, configured, and/or arranged as described herein on at least a portion of the substrate 1020. The process of forming the metallization layer 604 may include utilizing one or more manufacturing techniques including print screening for solder paste, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the process of forming IPD components 600 may include arranging the at least one device on the substrate 606. More specifically, the capacitor 952 may be constructed, configured, and/or arranged as described herein on the substrate 804 of the second IPD component 800. In one aspect, the capacitor 952 may be arranged as described herein on the substrate 804 with an adhesive, soldering, sintering, eutectic bonding, ultrasonically welding, and/or the like as described herein.

More specifically, the process of forming IPD components 600 may include manufacturing to form the first IPD component 200, the second IPD component 800, the third IPD component 300 and/or the fourth IPD component 1000 in a panel, a wafer, and/or the like. The process of forming IPD components 600 may include implementing a pick and place assembly to place the capacitor 952 on the second IPD component 800 of the panel.

The process of forming IPD components 600 may include implementing a reflow process with the panel. The process of forming IPD components 600 may include cutting the panel and/or the wafer utilizing cutting equipment such as wafer, circuit board, or package sawing equipment to singulate the second IPD component 800 from the panel or the wafer, which may have the advantage that the second IPD component 800 may be arranged on dicing tape on a ring frame, which can be directly loaded to the Die Attach equipment for subsequent assembly into package 100.

In one aspect, the process of forming IPD components 600 may include may processing utilizing a surface mount technology (SMT) line. A surface mount technology (SMT) line may utilize numerous processes including solder printing, component placement, solder reflow, and/or the like. additional processes may include a flux cleaning step to remove all flux residues, wire bonding, dicing, mounting to dicing tape, dicing, either mechanical sawing or laser cutting, or a combination of both, and component testing. Additionally, the first IPD component 200, the third IPD component 300, and/or the second IPD component 800 may be arranged on dicing tape that may then serve as input for the Die Attach equipment.

Figure 22:
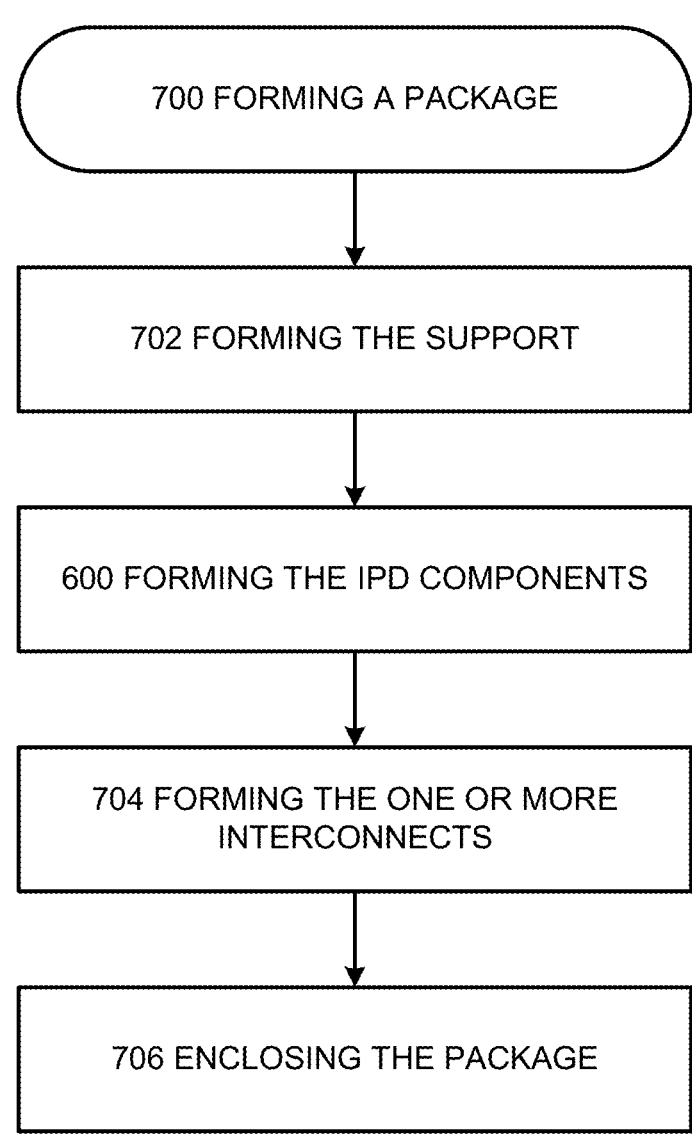
FIG. 22 shows a process of making a package according to the disclosure.

FIG. 22 shows a process of making a package according to the disclosure.

In particular, FIG. 22 illustrates a process of forming a package 700 that relates to the package 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein. Additionally, the process of forming a package 700 may include any other aspects of the disclosure described herein.

Initially, the process of forming a package 700 may include a process of forming the support 702. More specifically, the support 102 may be constructed, configured, and/or arranged as described herein. In one aspect, the process of forming the support 702 may include forming the support 102 as a support, a surface, a package support, a package surface, a package support surface, a flange, a heat sink, a common source heat sink, and/or the like.

The process of forming a package 700 may include a process of forming IPD components 600. More specifically, the first IPD component 200, the second IPD component 800, the third IPD component 300, and/or the fourth IPD component 1000 may be constructed, configured, and/or arranged as described herein with reference to FIG. 21 and the associated description thereof. Thereafter, the process of forming IPD components 600 may further include attaching the first IPD component 200, the second IPD component 800, the third IPD component 300, and/or the fourth IPD component 1000 to the support 102. In this regard, the first IPD component 200, the second IPD component 800, the third IPD component 300, and/or the fourth IPD component 1000 may be mounted on the upper surface of the support 102 and/or the first IPD component 200 by an adhesive, soldering, sintering, eutectic bonding, ultrasonically welding, and/or the like as described herein.

The process of forming a package 700 may include a process of forming the one or more interconnects 704. More specifically, the one or more interconnects 104 and/or the one or more shunt interconnects 164 may be constructed, configured, and/or arranged as described herein. In one aspect, the process of forming the one or more interconnects 704 may include forming the one or more interconnects 104 and/or the one or more shunt interconnects 164 by forming one or more wires, leads, vias, edge platings, circuit traces, tracks, and/or the like. In one aspect, the process of forming the one or more interconnects 704 may include connecting the one or more interconnects 704 by an adhesive, soldering, sintering, eutectic bonding, ultrasonic welding, a clip component, and/or the like as described herein.

The process of forming a package 700 may include a process of enclosing the package 706. More specifically, the package 100 may be constructed, configured, and/or arranged as described herein. In one aspect, the process of enclosing the package 706 may include forming an open cavity configuration, an over-mold configuration, or the like.

Figure 23:
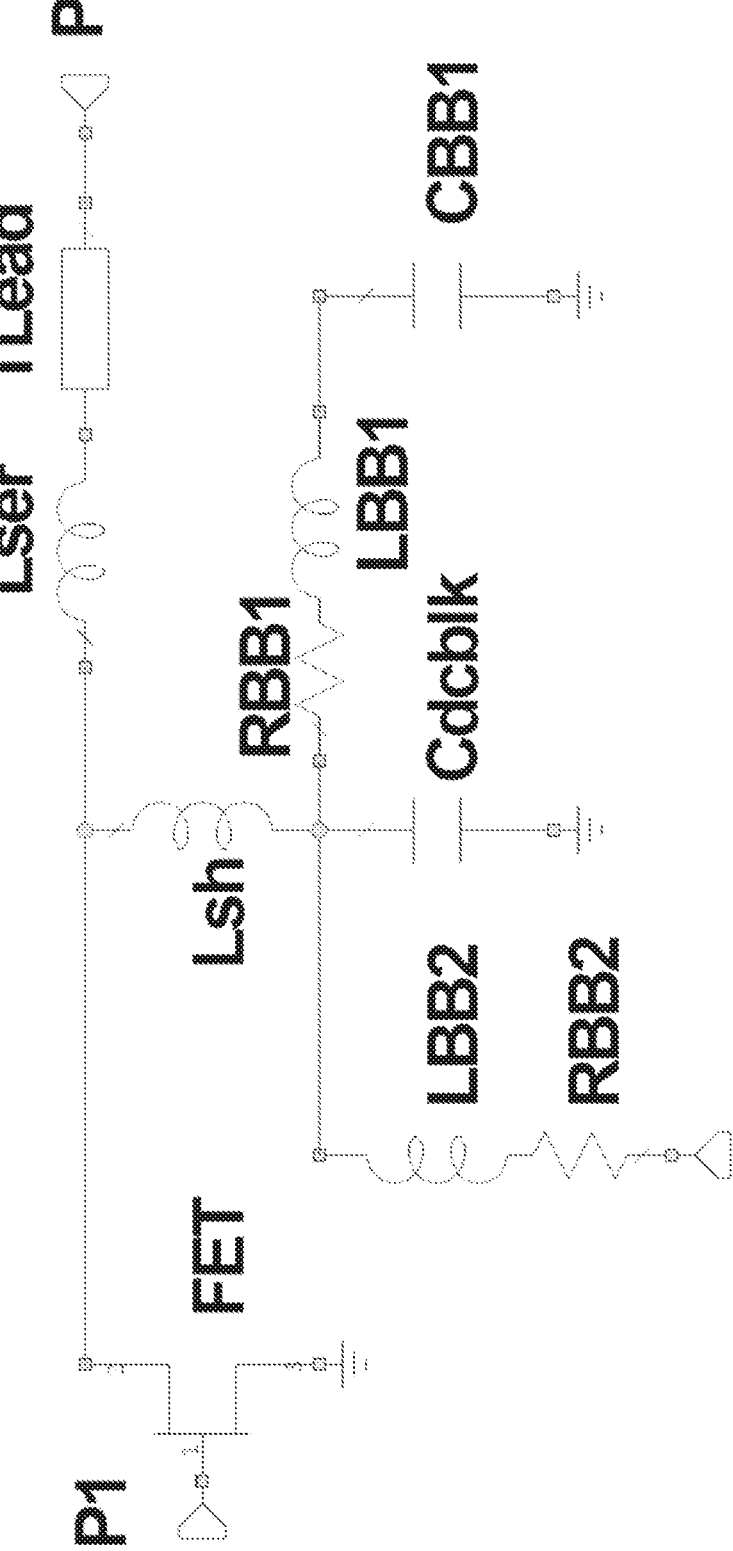
FIG. 23 illustrates an equivalent circuit for a current RF power device for simulation purposes.

FIG. 23 illustrates an equivalent circuit for a current RF power device for simulation purposes.

In particular, FIG. 23 illustrates an equivalent circuit for a current RF power device for simulation purposes implemented without the resistor 902. In this configuration, a large non-negligible parasitic output capacitance (Cout) of a FET is resonated out at a fundamental RF frequency by using a shunt inductor (Lsh), which is connected to a flange or ground through a DC blocking capacitor (Cdcblk). The DC blocking capacitor (Cdcblk) is used to connect the baseband decoupling capacitors (CBB1). Current RF power devices may be implemented inside a package with a die, an output shunt match capacitor and a baseband decoupling capacitor. The current RF power device may have the shunt output match with the in-package baseband decoupling capacitor.

In the current RF power device, the internal baseband decoupling capacitor (CBB2) is mounted on a PCB and is connected to the DC blocking capacitor (Cdcblk) through bonding wires. An external baseband decoupling capacitor can be connected to the DC blocking capacitor (Cdcblk) as well through other bonding wires and side leads. Additional baseband decoupling capacitors can be connected through a bias line.

Figure 24:
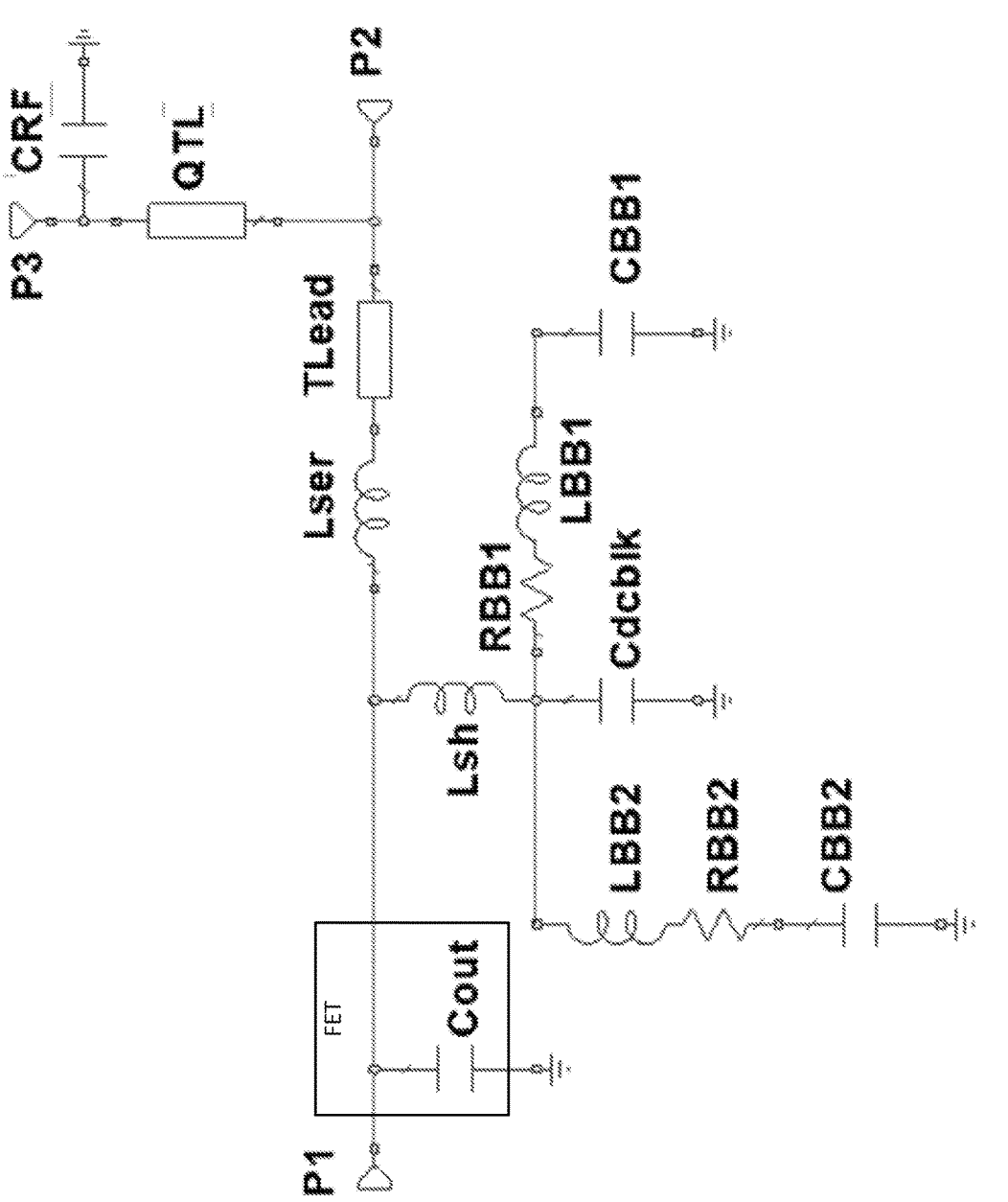
FIG. 24 illustrates another equivalent circuit equivalent circuit for a current RF power device for simulation purposes.

FIG. 24 illustrates another equivalent circuit equivalent circuit for a current RF power device for simulation purposes.

In particular, FIG. 24 illustrates another equivalent circuit equivalent circuit for a current RF power device for simulation purposes implemented without the resistor 902. The FIG. 24 equivalent circuit includes the external baseband decouple capacitor (CBB2) and a bias line (QTL) which has a quarter wave length at the RF fundamental frequency. The end of the quarter wave length transmission line is connected to ground with a capacitor which value has low impedance at the fundamental frequency so that it can provide RF short to the bias line (QTL).

For the baseband impedance simulation purposes, a power supply port (P3) is left open, an output RF signal port (P2) is terminated with 50 Ohms. The simulated impedances are seen from a port (P1), which is equivalent to the intrinsic current source of devices.

Figure 25:
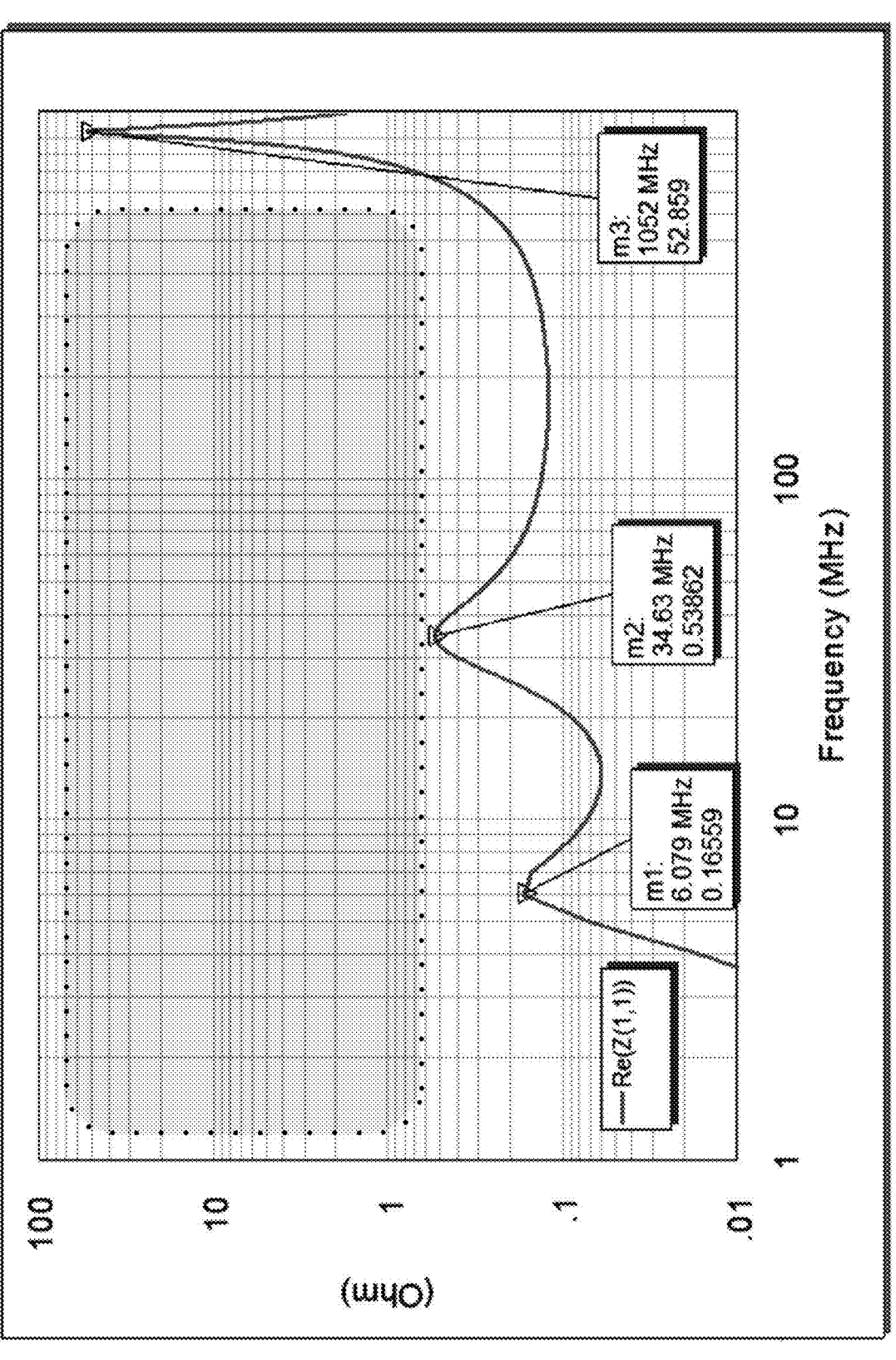
FIG. 25 illustrates exemplary simulated baseband impedances of the circuit illustrated in FIG. 24.

FIG. 25 illustrates exemplary simulated baseband impedances of the circuit illustrated in FIG. 24.

In particular, as shown in FIG. 25, the simulated real part of a baseband impedance seen from port (P1) is shown in logarithmic scale. Multiple impedance peaks are observed from an interaction of the capacitors and the inductors. For wideband operation, the impedance peaks need to be damped or an operation region is limited below the frequency where the impedance peak is high. In the simulation of FIG. 20, there are three baseband impedance peaks. The first two impedances are suppressed below 1 Ohm. However, the third peak has significantly large impedance, which impacts the baseband termination. Accordingly, for wideband operation, the shaded area in FIG. 25 needs to be maximized either by suppressing the peak impedances or increasing the frequency of the unsuppressed peak impedance which is the third peak of FIG. 25.

Accordingly, the disclosure has provided IPD components, a RF product that implements IPD components, and/or the like configured for utilization of a damping resistor to improve linearizability of the RF power amplifiers.

In aspects of the disclosure, a package includes: an IPD component comprising a resistor 902 arranged on a thermally conductive dielectric substrate; and a second IPD component 800 that comprises a capacitor 952 arranged on a thermally conductive dielectric substrate. Wherein the thermally conductive dielectric substrate of the IPD component comprises silicon carbide (SiC). Wherein the thermally conductive dielectric substrate of the second IPD component 800 comprises silicon carbide (SiC). Wherein the IPD component comprises a first IPD component 200 configured as an output capacitor IPD 292. Wherein the output capacitor IPD 292 comprises a DC blocking capacitor 904. Wherein the output capacitor IPD 292 is attached to the support 102. Wherein the second IPD component 800 is attached to the support 102. Wherein the resistor 902 is implemented as a thin film resistor and/or a bulk resistor. Further comprising a first IPD component 200 configured as an output capacitor IPD 292, wherein the IPD component comprises a third IPD component 300. Wherein the first IPD component 200 comprises silicon carbide (SiC) substrate. Further comprising a fourth IPD component, wherein the fourth IPD component 1000 comprises a resistor 1002 and/or a capacitor 1004. Further comprising an input network 294, wherein the fourth IPD component 1000 connected to the input network 294.

The following are a number of nonlimiting EXAMPLES of aspects of the disclosure.

One EXAMPLE includes: a transistor device that includes a metal submount. The transistor device in addition includes a transistor die arranged on said metal submount. The transistor device moreover includes an IPD component arranged on said metal submount, the IPD component having a baseband damping resistor arranged on a thermally conductive dielectric substrate. The transistor device also includes a second IPD component arranged on said metal submount, the second IPD component may include a baseband decoupling capacitor arranged on a thermally conductive dielectric substrate.

The above-noted EXAMPLE may further include any one or a combination of more than one of the following EXAMPLES: The transistor device of the above-noted EXAMPLE where the thermally conductive dielectric substrate of the IPD component may include silicon carbide (SiC). The transistor device of the above-noted EXAMPLE where the thermally conductive dielectric substrate of the second IPD component may include silicon carbide (SiC). The transistor device of the above-noted EXAMPLE where the IPD component may include a first IPD component configured as an output capacitor IPD. The transistor device of the above-noted EXAMPLE where the output capacitor IPD may include a DC blocking capacitor. The transistor device of the above-noted EXAMPLE where the output capacitor IPD is attached to the metal submount. The transistor device of the above-noted EXAMPLE where the second IPD component is attached to the metal submount. The transistor device of the above-noted EXAMPLE where the baseband damping resistor is implemented as a thin film resistor and/or a bulk resistor. The transistor device of the above-noted EXAMPLE may include a first IPD component configured as an output capacitor IPD, where the IPD component may include a third IPD component. The transistor device of the above-noted EXAMPLE where the first IPD component may include silicon carbide (SiC) substrate. The transistor device of the above-noted EXAMPLE may include a fourth IPD component, where the fourth IPD component may include a resistor and/or a capacitor. The transistor device of the above-noted EXAMPLE may include an input network, where the fourth IPD component connected to the input network. The transistor device of the above-noted EXAMPLE where the transistor die may include one or multiple LDMOS transistor die. The transistor device of the above-noted EXAMPLE where the transistor die may include one or multiple GaN based HEMTs. The transistor device of the above-noted EXAMPLE where the transistor device may include a plurality of the transistor die. The transistor device of the above-noted EXAMPLE where the plurality of the transistor die are configured in a Doherty configuration.

One EXAMPLE includes: a process that includes providing a metal submount. The process in addition includes arranging a transistor die on said metal submount. The process moreover includes arranging an IPD component having a baseband damping resistor arranged on a thermally conductive dielectric substrate. The process also includes arranging a second IPD component that may include a baseband decoupling capacitor arranged on a thermally conductive dielectric substrate.

The above-noted EXAMPLE may further include any one or a combination of more than one of the following EXAMPLES: The process of the above-noted EXAMPLE where the thermally conductive dielectric substrate of the IPD component may include silicon carbide (SiC). The process of the above-noted EXAMPLE where the thermally conductive dielectric substrate of the second IPD component may include silicon carbide (SiC). The process of the above-noted EXAMPLE where the IPD component may include a first IPD component configured as an output capacitor IPD. The process of the above-noted EXAMPLE where the output capacitor IPD may include a DC blocking capacitor. The process of the above-noted EXAMPLE where the output capacitor IPD is attached to the metal submount. The process of the above-noted EXAMPLE where the second IPD component is attached to the metal submount. The process of the above-noted EXAMPLE where the baseband damping resistor is implemented as a thin film resistor and/or a bulk resistor. The process of the above-noted EXAMPLE may include arranging a first IPD component configured as an output capacitor IPD, where the IPD component may include a third IPD component. The process of the above-noted EXAMPLE where the first IPD component may include silicon carbide (SiC) substrate. The process of the above-noted EXAMPLE may include providing a fourth IPD component, where the fourth IPD component may include a resistor and/or a capacitor. The process of the above-noted EXAMPLE may include providing an input network, where the fourth IPD component connected to the input network. The process of the above-noted EXAMPLE where the transistor die may include one or multiple LDMOS transistor die. The process of the above-noted EXAMPLE where the transistor die may include one or multiple GaN based HEMTs. The process of the above-noted EXAMPLE where the transistor device may include a plurality of the transistor die. The process of the above-noted EXAMPLE where the plurality of the transistor die are configured in a Doherty configuration.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A transistor device, comprising:
a metal submount;
a transistor die arranged on said metal submount;
an IPD component arranged on said metal submount, the IPD component comprising a baseband damping resistor arranged on a thermally conductive dielectric substrate; and
a second IPD component arranged on said metal submount, the second IPD component comprises a baseband decoupling capacitor arranged on a second thermally conductive dielectric substrate.

2. The transistor device according to claim 1 wherein the thermally conductive dielectric substrate of the IPD component comprises silicon carbide (SiC).

3. The transistor device according to claim 1 wherein the second thermally conductive dielectric substrate of the second IPD component comprises silicon carbide (SIC).

4. The transistor device according to claim 1
wherein the IPD component comprises a first IPD component configured as an output capacitor IPD; and
wherein the thermally conductive dielectric substrate of the first IPD component is attached to the metal submount via a die attach material.

5. The transistor device according to claim 4
wherein the output capacitor IPD comprises a DC blocking capacitor; and
wherein the DC blocking capacitor comprises a lower capacitor metal, a capacitor dielectric material, and an upper capacitor metal on an upper surface of the second thermally conductive dielectric substrate.

6. The transistor device according to claim 4
wherein the thermally conductive dielectric substrate of the output capacitor IPD is attached to the metal submount via a die attach material; and
wherein the metal submount comprises a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, and/or a metal leadframe.

7. The transistor device according to claim 1
wherein the second thermally conductive dielectric substrate of the second IPD component is attached to the metal submount via a die attach material; and
wherein the metal submount comprises a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, and/or a metal leadframe.

8. The transistor device according to claim 1
wherein the baseband damping resistor is implemented as a thin film resistor and/or a bulk resistor arranged on an upper surface of the thermally conductive dielectric substrate; and
wherein the thermally conductive dielectric substrate of the IPD component is attached to the metal submount via a die attach material.

9. The transistor device according to claim 1 further comprising a first IPD component configured as an output capacitor IPD,
wherein the IPD component comprises a third IPD component.

10. The transistor device according to claim 9
wherein the first IPD component comprises a silicon carbide (SiC) substrate; and
wherein the transistor die, the IPD component, and the second IPD component are attached to said metal submount via a die attach material.

11. The transistor device according to claim 1 further comprising a fourth IPD component,
wherein the fourth IPD component comprises a resistor and/or a capacitor.

12. The transistor device according to claim 11 further comprising an input network, wherein the fourth IPD component is connected to the input network.

13. The transistor device according to claim 1 wherein the transistor die comprises one or multiple LDMOS transistor die.

14. The transistor device according to claim 1 wherein the transistor die comprises one or multiple GaN based HEMTs.

15. The transistor device according to claim 1 wherein the transistor device comprises a plurality of the transistor die.

16. The transistor device according to claim 15 wherein the plurality of the transistor die are configured in a Doherty configuration.

17. A process for implementing a transistor device, comprising, providing a metal submount;

arranging a transistor die on said metal submount;

arranging an IPD component comprising a baseband damping resistor arranged on a thermally conductive dielectric substrate; and arranging a second IPD component that comprises a baseband decoupling capacitor arranged on a second thermally conductive dielectric substrate.

18. The process for implementing a transistor device according to claim 17 wherein the thermally conductive dielectric substrate of the IPD component comprises silicon carbide (SiC).

19. The process for implementing a transistor device according to claim 17 wherein the second thermally conductive dielectric substrate of the second IPD component comprises silicon carbide (SiC).

20. The process for implementing a transistor device according to claim 17 wherein the IPD component comprises a first IPD component configured as an output capacitor IPD; and wherein the thermally conductive dielectric substrate of the first IPD component is attached to the metal submount via a die attach material.

21. The process for implementing a transistor device according to claim 20 wherein the output capacitor IPD comprises a DC blocking capacitor; and wherein the DC blocking capacitor comprises a lower capacitor metal, a capacitor dielectric material, and an upper capacitor metal on an upper surface of the second thermally conductive dielectric substrate.

22. The process for implementing a transistor device according to claim 20 wherein the thermally conductive dielectric substrate of the output capacitor IPD is attached to the metal submount via a die attach material; and wherein the metal submount comprises a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, and/or a metal leadframe.

23. The process for implementing a transistor device according to claim 17 wherein the second thermally conductive dielectric substrate of the second IPD component is attached to the metal submount via a die attach material; and wherein the metal submount comprises a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, and/or a metal leadframe.

24. The process for implementing a transistor device according to claim 17 wherein the baseband damping resistor is implemented as a thin film resistor and/or a bulk resistor arranged on an upper surface of the thermally conductive dielectric substrate; and wherein the thermally conductive dielectric substrate of the IPD component is attached to the metal submount via a die attach material.

25. The process for implementing a transistor device according to claim 17 further comprising arranging a first IPD component configured as an output capacitor IPD, wherein the IPD component comprises a third IPD component.

26. The process for implementing a transistor device according to claim 25 wherein the first IPD component comprises a silicon carbide (SiC) substrate; and wherein the transistor die, the IPD component, and the second IPD component are attached to said metal submount via a die attach material.

27. The process for implementing a transistor device according to claim 17 further comprising providing a fourth IPD component, wherein the fourth IPD component comprises a resistor and/or a capacitor.

28. The process for implementing a transistor device according to claim 27 further comprising providing an input network, wherein the fourth IPD component connected to the input network.

29. The process for implementing a transistor device according to claim 17 wherein the transistor die comprises one or multiple LDMOS transistor die.

30. The process for implementing a transistor device according to claim 17 wherein the transistor die comprises one or multiple GaN based HEMTs.

31. The process for implementing a transistor device according to claim 17 wherein the transistor device comprises a plurality of the transistor die.

32. The process for implementing a transistor device according to claim 31 wherein the plurality of the transistor die are configured in a Doherty configuration.

* * * * *